(12) United States Patent
Fukami et al.

(10) Patent No.: US 10,056,496 B2
(45) Date of Patent: Aug. 21, 2018

(54) DISPLAY DEVICE AND METHOD OF MANUFACTURING DISPLAY DEVICE

(71) Applicant: PANASONIC LIQUID CRYSTAL DISPLAY CO., LTD., Hyogo (JP)

(72) Inventors: Tetsuo Fukami, Hyogo (JP); Ryutaro Oke, Hyogo (JP)

(73) Assignee: Panasonic Liquid Crystal Display Co., Ltd, Hyogo (JP)

( * ) Notice: Subject to any disclaimer, the term of this patent is extended or adjusted under 35 U.S.C. 154(b) by 0 days.

(21) Appl. No.: 15/835,038

(22) Filed: Dec. 7, 2017

(65) Prior Publication Data

US 2018/0097121 A1    Apr. 5, 2018

Related U.S. Application Data

(63) Continuation of application No. 14/743,974, filed on Jun. 18, 2015, now Pat. No. 9,871,142.

(51) Int. Cl.
| | |
|---|---|
| *G02F 1/1343* | (2006.01) |
| *H01L 29/786* | (2006.01) |
| *H01L 27/12* | (2006.01) |
| *H01L 27/32* | (2006.01) |
| *G09G 3/36* | (2006.01) |

(52) U.S. Cl.
CPC ...... *H01L 29/78669* (2013.01); *H01L 27/124* (2013.01); *G09G 3/3644* (2013.01); *G09G 2300/0434* (2013.01); *H01L 27/1288* (2013.01); *H01L 27/3248* (2013.01)

(58) Field of Classification Search
CPC . G02F 1/1362; H01L 27/124; H01L 27/1222; H01L 27/1288; H01L 29/78669; G09G 3/3696; G09G 3/2003; G09G 3/3648

USPC .................................................. 349/149, 151
See application file for complete search history.

(56) References Cited

U.S. PATENT DOCUMENTS

| | | | |
|---|---|---|---|
| 9,239,502 B2* | 1/2016 | Huang | G02F 1/13458 |
| 2002/0008797 A1 | 1/2002 | Yamazaki et al. | |
| 2008/0158140 A1 | 7/2008 | Takatori et al. | |

(Continued)

OTHER PUBLICATIONS

Non-Final Office Action issued in U.S. Appl. No. 14/743,974, dated Dec. 1, 2016.

(Continued)

*Primary Examiner* — James Dudek
(74) *Attorney, Agent, or Firm* — McDermott Will & Emery LLP

(57) ABSTRACT

A method of manufacturing a display device is provided. The display device includes a display region divided into a first display region and a second display region by a border region extending in the second direction, a plurality of data lines including a plurality of first data lines arranged in the first display region, and a plurality of second data lines arranged in the second display region. Each of the plurality of first data lines and each of the plurality of second data lines are electrically isolated from each other. The method includes steps of forming a plurality of conductive lines on a substrate extending from a top side to a bottom side of the display region in the first direction, and separating the plurality of conductive lines into the plurality of first data lines and the plurality of second data lines.

5 Claims, 30 Drawing Sheets

(56) References Cited

U.S. PATENT DOCUMENTS

2010/0053530 A1  3/2010  Peng et al.
2013/0215372 A1  8/2013  Oke

OTHER PUBLICATIONS

Final Office Action issued in U.S. Appl. No. 14/743,974, dated May 1, 2017.
Notice of Allowance issued in U.S. Appl. No. 14/743,974, dated Sep. 7, 2017.

* cited by examiner

SDL SEM TFT SDL GAL

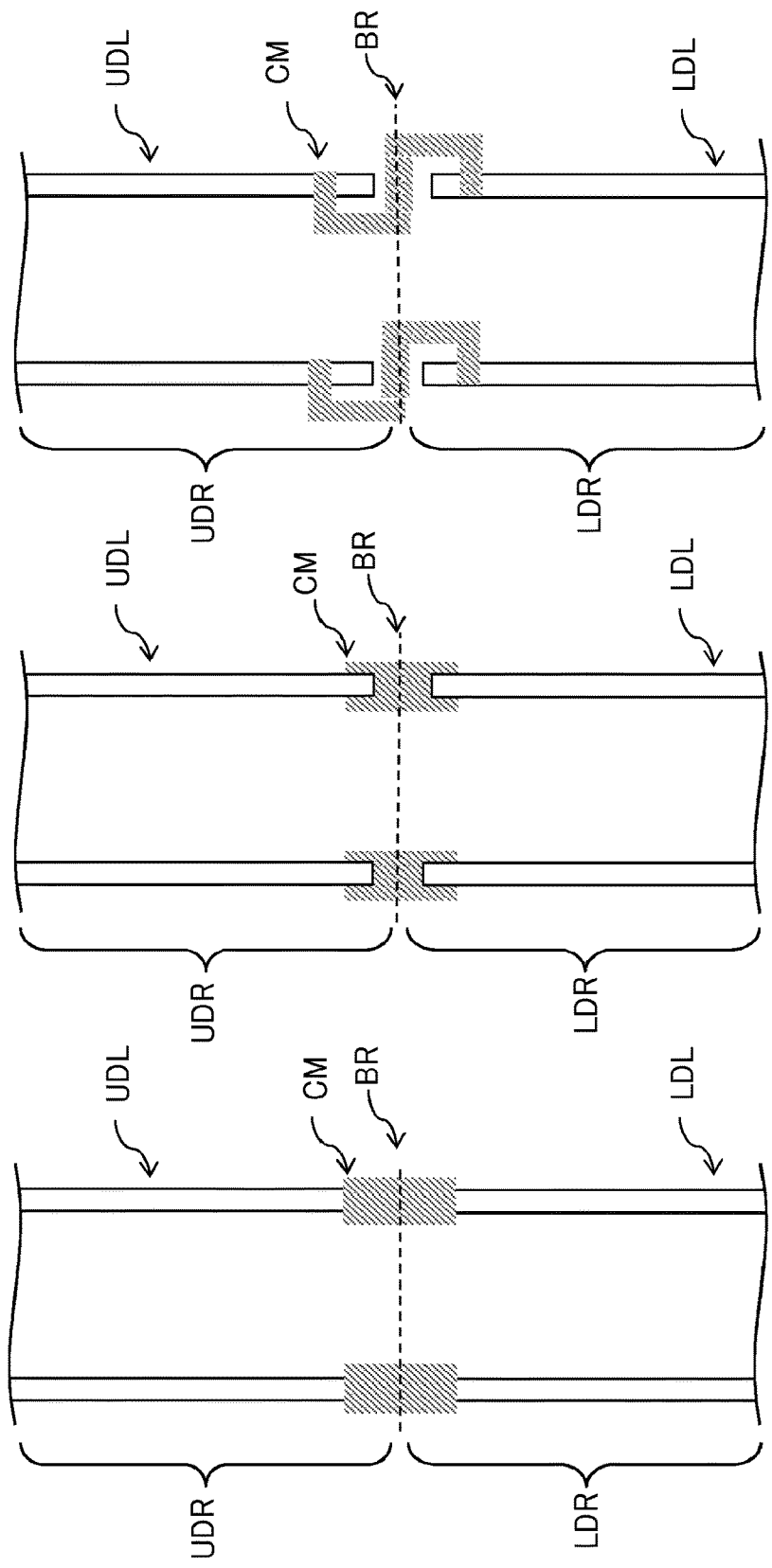

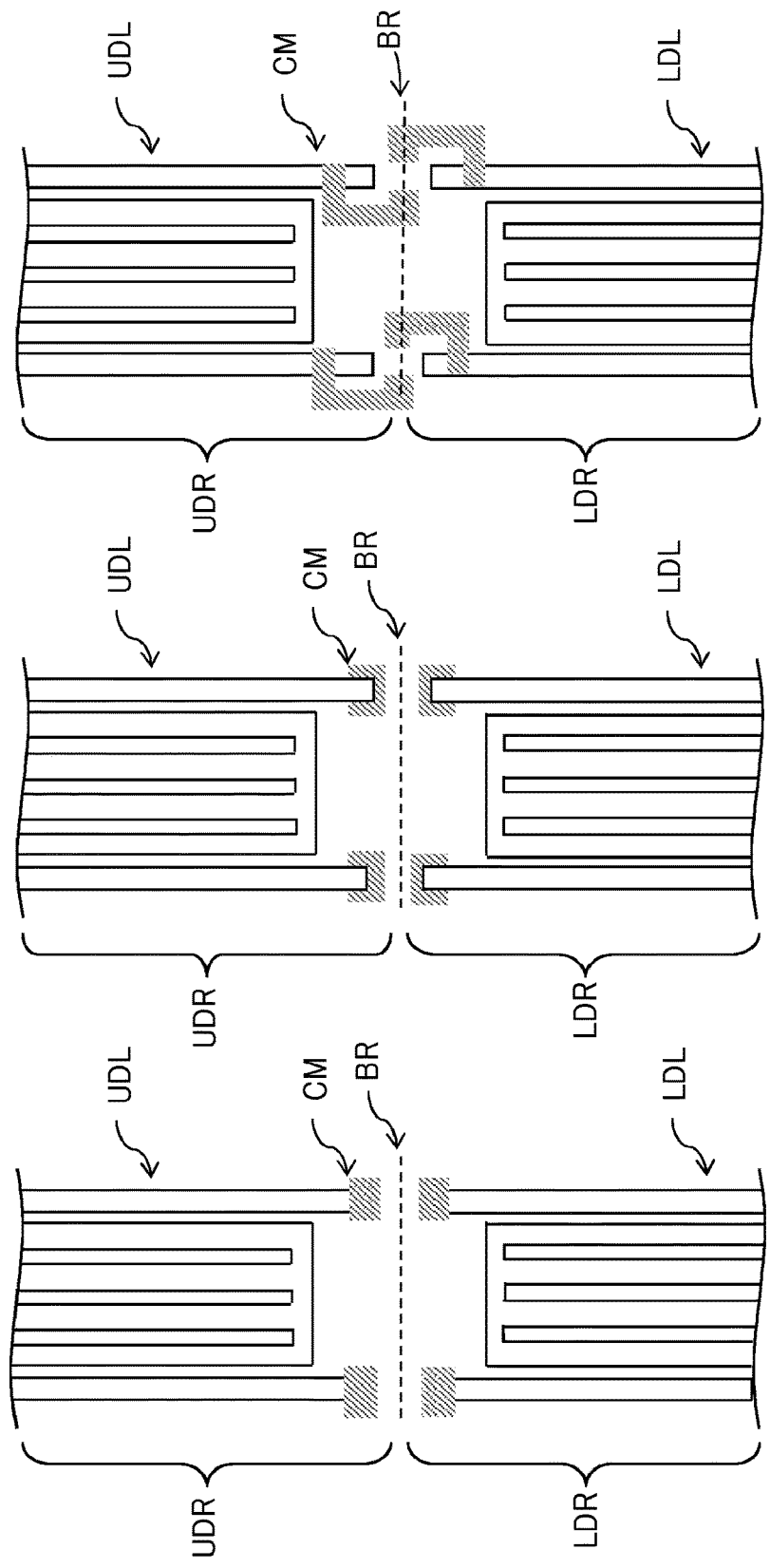

DISPLAY DEVICE AND METHOD OF MANUFACTURING DISPLAY DEVICE

RELATED APPLICATIONS

This application is the Continuation application of U.S. patent application Ser. No. 14/743,974, filed on Jun. 18, 2015, the entire disclosure of which Application is incorporated by reference herein.

TECHNICAL FIELD

The present disclosure relates to a display device and a method of manufacturing the same.

BACKGROUND

The display size of liquid crystal display (LCD) devices, such as liquid crystal televisions, has been increasing in recent years, that is to say, the area of one display region in a liquid crystal panel has been increasing. In addition, the resolution of the LCD devices has been increasing in recent years, that is to say, the number of pixels that form one display region in the liquid crystal display panel has been increasing. When the display size of LCD device increases, a length of data lines (video signal lines) also increases. It causes a delay of video signals within the data lines, which deteriorates an image quality. In order to prevent an image quality from deteriorating, multiple signal input terminals for data lines are provided on the top and bottom of the display region in an LCD device, for example, in recent years.

In the case where signal input terminals for data lines are provided on the top and bottom of the display region, one display region is divided into an upper region and a lower region along a border region in the direction in which gate lines extend. The data lines connected to drains of TFT (thin film transistor) elements of pixels which belong to the upper region above the border region are electrically isolated from data lines connected to drains of TFT elements of pixels which belong to the lower display region below the border region.

In this configuration, images can be displayed side-by-side in the upper region and the lower region. Therefore, since the data lines are divided into two lines, time required to display one frame for an image becomes half compared with the case where the long signal lines are used, and thus, it becomes easy to deal with an increase in the speed of display.

In the above configuration, however, the image quality greatly changes along the above described border region and an undesirable line image may be visible along the border region. In particular, it has been found that a difference in characteristics between a TFT formed around the border region and a TFT formed far from the border region causes the image deterioration such as an undesirable lateral line around the border region.

SUMMARY

As the result of diligent efforts, the inventors have found that the following manufacturing method is effective in addressing the foregoing problems associated with the quality of image displayed on the display device.

In one general aspect, the present application describes a method of manufacturing a display device. The display device includes a display region for displaying an image, data lines extending in a first direction in the display region, and gate lines extending in a second direction which is different from the first direction in the display region. The display region is divided into a first display region and a second display region by a border region extending in the second direction. The data lines include first data lines arranged in the first display region, and second data lines arranged in the second display region. Each first data line and each second data line are electrically isolated from each other. The method includes steps of forming conductive lines on a substrate extending from a top side to a bottom side of the display region in the first direction, and separating the plurality of conductive lines into the plurality of first data lines and the plurality of second data lines.

Another general aspect of the present disclosure is directed to a method of manufacturing a display device. The display device includes a display region for displaying an image, a plurality of data lines extending in a first direction in the display region, and a plurality of gate lines extending in a second direction which is different from the first direction in the display region. The display region is divided into a first display region and a second display region by a border region extending in the second direction, the plurality of data lines include a plurality of first data lines arranged in the first display region, and a plurality of second data lines arranged in the second display region, and each of the plurality of first data lines and each of the plurality of second data lines are electrically isolated from each other. The method includes steps of forming a plurality of first metal lines extending in the first direction in the first display region and a plurality of second metal lines extending in the first direction in the second display region, forming a plurality of conductive members between the first and second display regions, each of the plurality of conductive members electrically connecting one of the plurality of first metal lines and corresponding one of the plurality of second metal lines, and forming the plurality of first data lines and the plurality of second data lines by cutting the plurality of conductive members.

In another general aspect of the present disclosure, a display device includes a display region for displaying an image, data lines extending in a first direction in the display region, and pixel electrodes, gate lines extending in a second direction which is different from the first direction in the display region. The display region is divided into a first display region and a second display region by a border region extending in the second direction. The data lines include first data lines arranged in the first display region, and second data lines arranged in the second display region. Each of the first data lines is electrically isolated from each of the second data lines. Each of the first data lines and the second data lines includes a metal layer and a conductive member. The conductive member is made of a same material as the plurality of pixel electrodes. The conductive member is overlapped at least an end part of the metal layer of each of first data lines and second data lines in the border region.

BRIEF OF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B to 11A, 11B show an exemplary method of manufacturing a liquid crystal display device according to a first embodiment of the present disclosure. FIGS. 4A to 11A show cross sectional views corresponding to A-A' of FIG. 2 and FIGS. 4B to 11B show cross sectional views corresponding to B-B' of FIG. 2

FIGS. 13A to 13C are schematic partial plan views of data lines of the liquid crystal display device in a vicinity of a border region according to the second embodiment of the present disclosure.

FIGS. 14A to 14C are schematic partial plan views of data lines of the liquid crystal display device in the vicinity of the border region according to the second embodiment of the present disclosure.

DETAILED DESCRIPTION

It is to be understood that the following disclosure provides many different embodiments, or examples, for implementing different features of the present subject matter. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "lower," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Further, the order of the steps/processes/operations may not be limited to the described order and may be interchangeable. In addition, the term "made of" may mean either "comprising" or "consisting of."

First Embodiment

Figure 1:
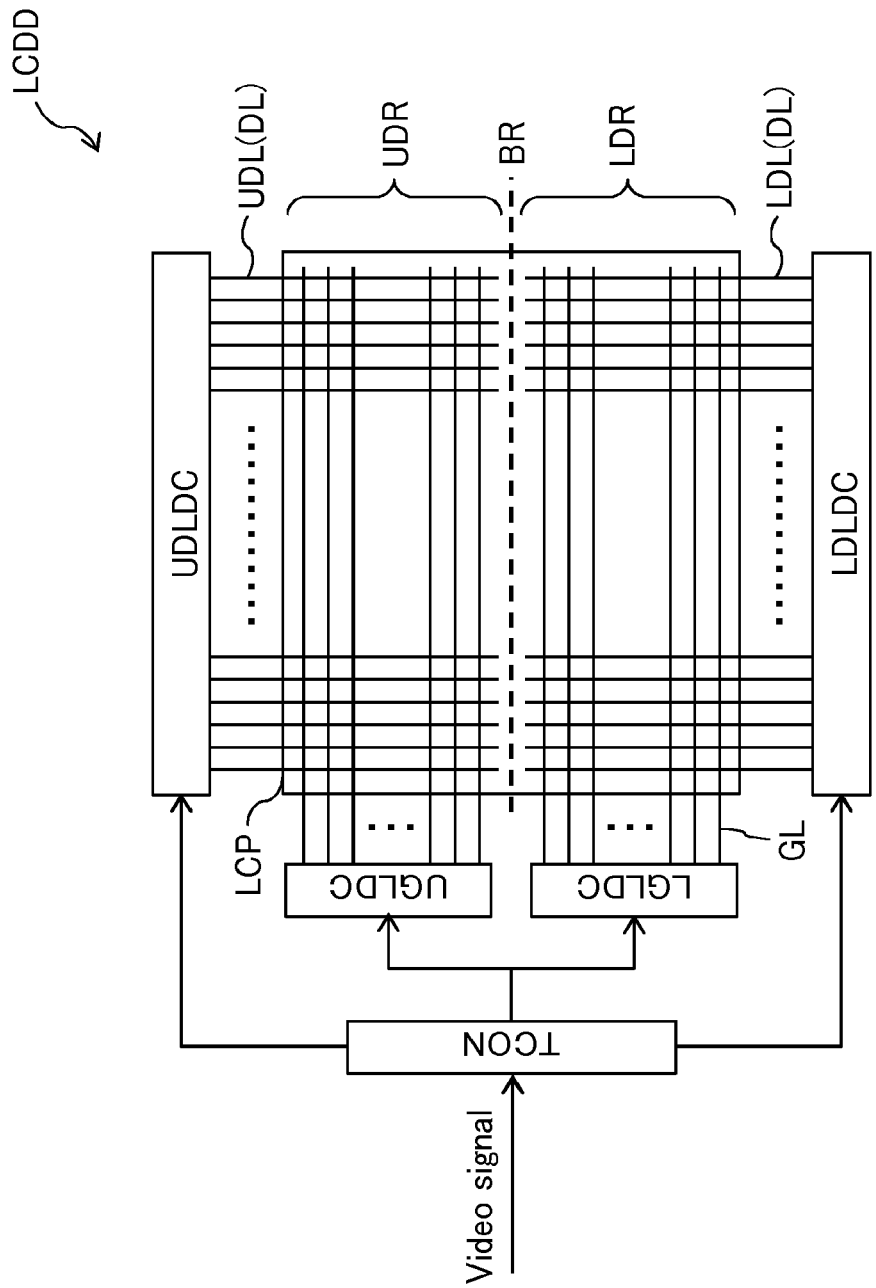
FIG. 1 is an exemplary schematic view illustrating a configuration of a liquid crystal display device according to embodiments of the present disclosure.

FIG. 1 is an exemplary schematic view illustrating a configuration of a liquid crystal display device LCDD. The liquid crystal display device LCDD includes a liquid crystal panel LCP, gate line driving circuits LGLDC, UGLDC, data line driving circuits UDLDC, LDLDC, a control device TCON, a backlight unit (not shown), and a backlight driving circuit (not shown).

The liquid crystal display device LCDD employs, for example, an in-plane switching (IPS) mode and an active matrix driving method. The liquid crystal panel LCP includes a color filter substrate and a thin film transistor (TFT) substrate, which are arranged opposed to each other with a gap, and liquid crystal is filled in the gap.

On a surface of the TFT substrate on the liquid crystal side, TFTs, data lines DL, gate lines GL, pixel electrodes PIT (see, FIG. 3A), and common electrodes CIT are disposed. The pixel electrodes PIT and the TFTs are respectively arranged in a matrix. In each pixel, the common electrode CIT (see, FIG. 3A) is arranged as well, which is made of a transparent electrode material similar to the pixel electrodes PIT. Data lines DL are provided for respective columns of the TFTs (lines in the vertical direction of FIG. 1), and are each connected in common to source electrode SDL (see, FIG. 3A) of TFTs in the corresponding column. Gate lines GL are provided for respective rows of the TFTs (lines in the horizontal direction of FIG. 1), and are each connected in common to gate electrodes of TFTs in the corresponding row. Each of the data lines DL is arranged along a pixel separation region provided between pixel columns, and each of the gate lines GL is arranged along a pixel separation region provided between pixel rows.

Further, the data lines DL and the gate lines GL are arranged so as to intersect with each other. The data lines DL extend in a direction substantially perpendicular to a direction in which the gate lines GL extend. Each of the TFTs has a drain electrode SDL connected to the pixel electrode PIT corresponding to the TFT.

On a surface of the color filter substrate on the liquid crystal side, a black matrix (not shown) and a color filter (not shown) are formed. The black matrix is a light blocking film which is formed in the pixel separation regions.

The TFT substrate and the color filter substrate each include an alignment film (not shown) facing a liquid crystal layer (not shown). The alignment film is subjected to rubbing processing. But the alignment film may be subjected to photo alignment processing.

The conduction state of the TFTs is controlled in accordance with a gate signal applied to the gate line GL. The pixel electrode PIT is electrically connected to the data line DL via the TFT in an ON state, and a signal voltage (pixel voltage) based on a pixel value is applied from the data line DL to the pixel electrode PIT. A predetermined common potential provided in common to respective pixels is applied to the common electrode CIT via a common metal line CMT. The alignment direction of the liquid crystals is controlled for each pixel by an electric field generated in accordance with a potential difference between the pixel electrode PIT and the common electrode CIT. In this manner, the transmittance of light entering from the backlight unit is changed so that an image is formed on a display surface.

As shown in FIG. 1, the area of the liquid crystal panel LCP is divided into an upper display region UDR and a lower display region LDR by a border region BR. The liquid crystal display device LCDD employs a division driving method, in which a display region is horizontally divided into the upper display region UDR and the lower display region LDR, and the regions are subjected to vertical scanning in a parallel manner.

In order to carry out the division driving, each of the data lines DL is divided into an upper data line UDL arranged in the upper display region UDR and a lower data line LDL arranged in the lower display region LDR, and each upper data line UDL is connected to the upper data line driving circuits UDLDC and each lower data line LDL is connected to the lower data line driving circuit LDLDC. Further, the gate lines GL in the upper display region UDR are connected to an upper gate line driving circuit UGLDC, and the gate lines GL in the lower display region LDR are connected to a lower gate line driving circuit LGLDC.

A video signal received by a tuner or an antenna (now shown) and processed by a signal processing circuit, or a video signal generated by another device such as an image reproducing device is input into the control device. Based on the input video signal, the control device generates pixel data indicating a gradation value for each pixel and outputs the generated pixel data to the upper data line driving circuits UDLDC and the lower data line driving circuits LDLDC, and generates a timing signal for each portion of the liquid crystal display device LCDD.

The upper gate line driving circuit UGLDC and the lower gate line driving circuit LGLDC select the gate lines GL in the upper display region UDR and the lower display region LDR in order, and output a gate signal to the selected gate line GL. With this, TFTs in the selected pixel row are turned ON.

The data line driving circuits UDLDC, LDLDC output, in synchronization with the selection of the gate lines GL performed by the gate line driving circuits UGLDC, LGLDC, voltages corresponding to each pixel data of the corresponding row to the data lines DL.

Figure 2:
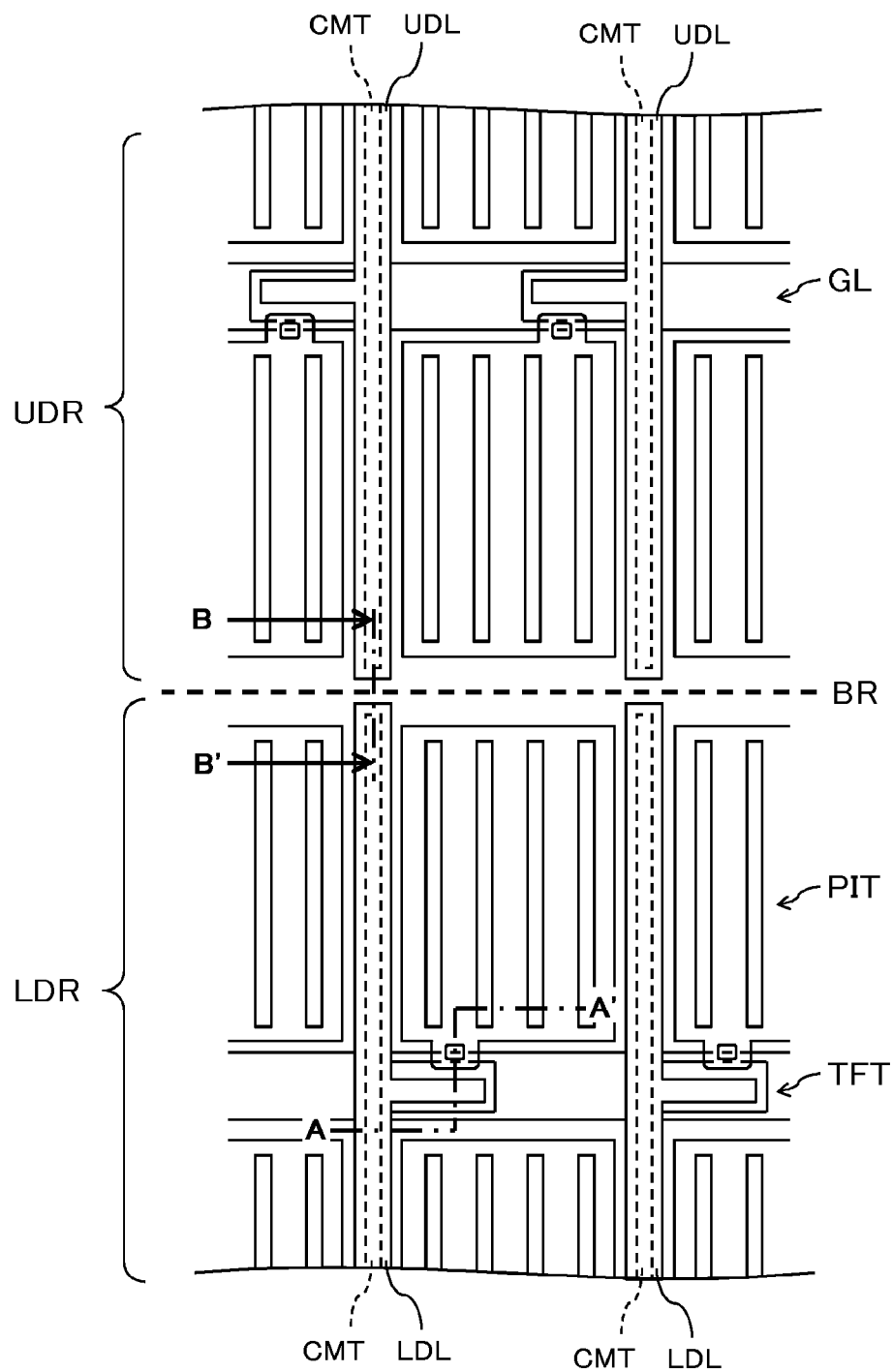
FIG. 2 is an exemplary schematic partial plan view of data lines of the liquid crystal display device in a vicinity of a border region according to embodiments of the present disclosure.

FIG. 2 is a schematic partial plan view of data lines UDL, LDL of the liquid crystal display device LCDD in a vicinity of the border region BR and schematically illustrates shapes and arrangement of TFTs, data lines UDL, LDL gate lines GL, pixel electrodes PIT. In particular, the pixel electrode PIT is illustrated so as to represent a pixel effective region in which liquid crystal alignment is controlled. The shape of the pixel electrode PIT is not limited to the shape shown in FIG. 2 and may have different shapes according to applications of the LCDD. A divided position of the data lines DL, which is the border region BR between the upper and lower data lines UDL, LDL, is arranged between the upper display region UDR and the lower display region LDR. The border region BR extends in the direction in which the gate lines GL extend. No gate line GL is formed in the border region BR. A TFT is formed at an intersecting part between a data line UDL, LDL and a gate line GL.

Figure 3A:
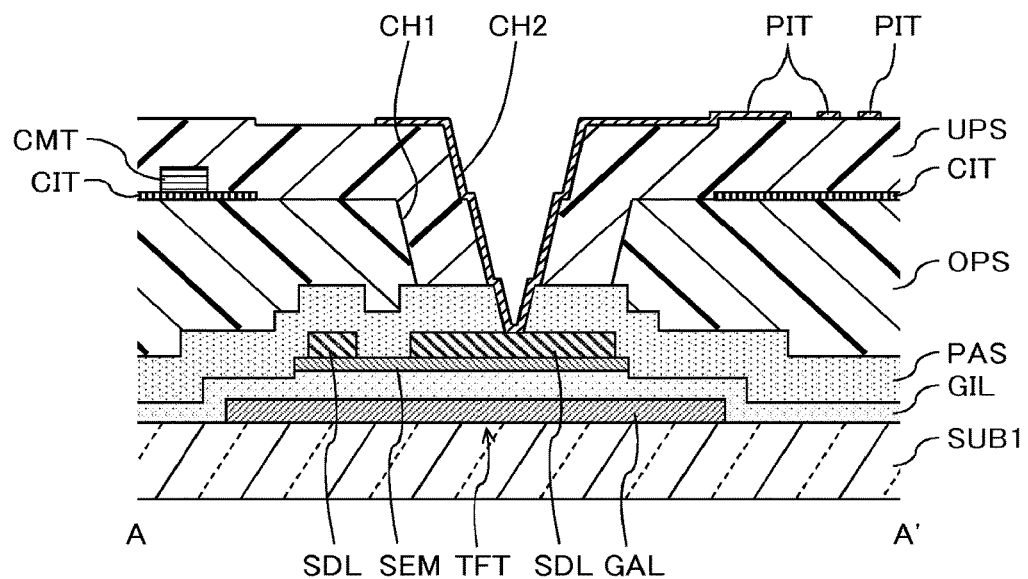
FIG. 3A is an exemplary cross-sectional view taken along A-A' line of FIG. 2.

FIG. 3A is an exemplary cross-sectional view taken along A-A' line of FIG. 2. In FIG. 3A, an area near a TFT included in each of the pixels of the TFT substrate is shown enlarged.

On the TFT substrate, a TFT is formed on a transparent substrate SUB1 made of non-alkali glass or the like. The TFT includes a gate electrode GAL, a semiconductor layer SEM, a source electrode SDL, and a drain electrode SDL. The semiconductor layer SEM is formed on the gate electrode GAL, and a gate insulating layer GIL is formed between the gate electrode GAL and the semiconductor layer SEM. A source electrode SDL and a drain electrode SDL are formed on the semiconductor layer SEM.

The TFT and the gate insulating layer GIL are covered by a passivation layer PAS, made by, for example, an insulating material such as silicon nitride. The passivation layer PAS is covered by an insulating layer, for example, an organic insulating layer OPS. The organic insulating layer OPS is formed relatively thick and has a flat surface. A common electrode CIT is formed on the organic insulating layer OPS, and electrically connected to a common metal line CMT. The common electrode CIT and the organic insulating layer OPS are covered by an upper insulating layer UPS. A pixel electrode PIT is formed on the upper insulating layer UPS. In some embodiment, the positional relationship in the up-down direction of the common electrode CIT and the pixel electrode PIT may be reversed.

A first contact hole CH1 is formed in the organic insulating layer OPS in a position above the drain electrode SDL such that the passivation layer PAS is exposed at the bottom thereof. The upper insulating layer UPS contacts the first contact hole CH1, and contacts the passivation layer PAS. A second contact hole CH2 is formed in the passivation layer PAS and the upper insulating layer UPS, through inside the first contact hole CH1 of the organic insulating layer OPS, such that the drain electrode SDL is exposed at the bottom thereof. The pixel electrode PIT is formed in the second contact hole CH2 to be connected to the drain electrode SDL.

The gate electrode GAL and source and drain electrodes SDL of the TFT, and the common metal layer CMT are made of metal such as Cu, Al, or the like. The semiconductor layer SEM is made of semiconductor such as amorphous Si or the like. The gate insulating layer GIL, the passivation layer PAS, and the upper insulating layer UPS are made of transparent inorganic insulating material, such as SiN or the like. The common electrode CIT and the pixel electrode PIT are transparent conductive films made of oxide, such as indium-tin oxide (ITO) or the like.

On the TFT substrate, an alignment film (not shown) is formed above the upper insulating layer UPS and the pixel electrode PIT, and a polarizer plate (not shown) is formed below the transparent substrate SUB1. A liquid crystal layer (not shown) is sandwiched by the TFT substrate and a color filter substrate (not shown), whereby a liquid crystal panel LCP is formed. When a driving circuit is mounted on the liquid crystal panel LCP, a liquid crystal display device LCDD is formed.

Figure 3B:
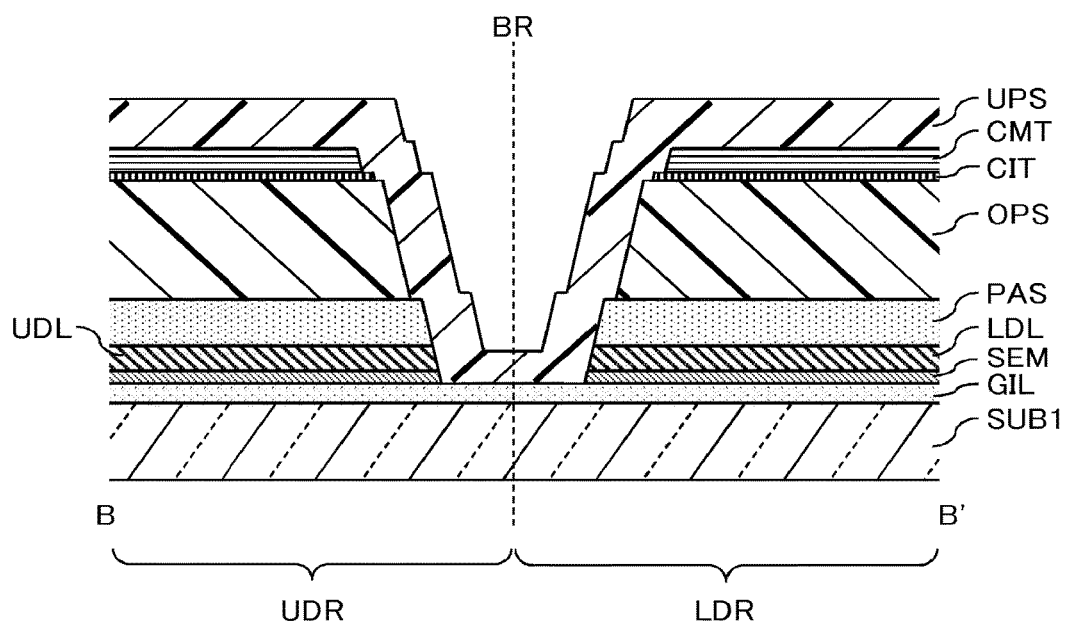
FIG. 3B is an exemplary cross-sectional view taken along B-B' line of FIG. 2.

FIG. 3B is an exemplary cross-sectional view taken along B-B' line of FIG. 2. In FIG. 3B, an area in a vicinity of the border region BR including ends of upper data lines UDL in the upper display region UDR and ends of lower data lines LDL in the lower display region LDR is shown enlarged. The upper data lines UDL in the upper display region UDR and the lower data lines LDL in the lower display region LDR are separated and isolated from each other by a space and the upper passivation layer UPS. As illustrated in FIG. 3B, only the gate insulating layer GIL and the upper insulating layer UPS are stacked on the border region BR, and films such as the gate insulating layer GIL, the semiconductor layer SEM, the data lines UDL, LDL, the passivation layer PAS, organic insulating layer OPS, the common electrode CIT, the common metal layer CMT, the upper passivation layer UPS are stacked adjacent to the border region BR on the transparent substrate SUB1.

FIGS. 4 to 11 show an embodiment of a manufacturing method for a liquid crystal display device LCDD according to one embodiment of the present disclosure. Cross sectional views FIGS. 4A to 11A taken along A-A' of FIG. 2 and cross sectional views FIGS. 4B to 11B taken along B-B' of FIG. 2 in these diagrams generally show various stages of the device during the manufacturing process.

In the present disclosure, a photolithography step refers to a step including a series of processing for forming a photoresist pattern, including coating of photoresist pattern, selective exposure using a photo mask, and development and cleaning, with detailed description thereof omitted below.

Figure 4A:
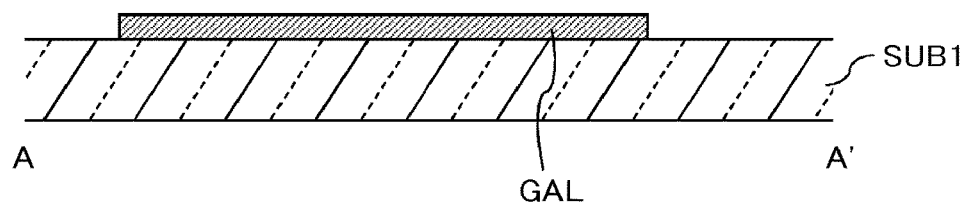
Figure 4B:
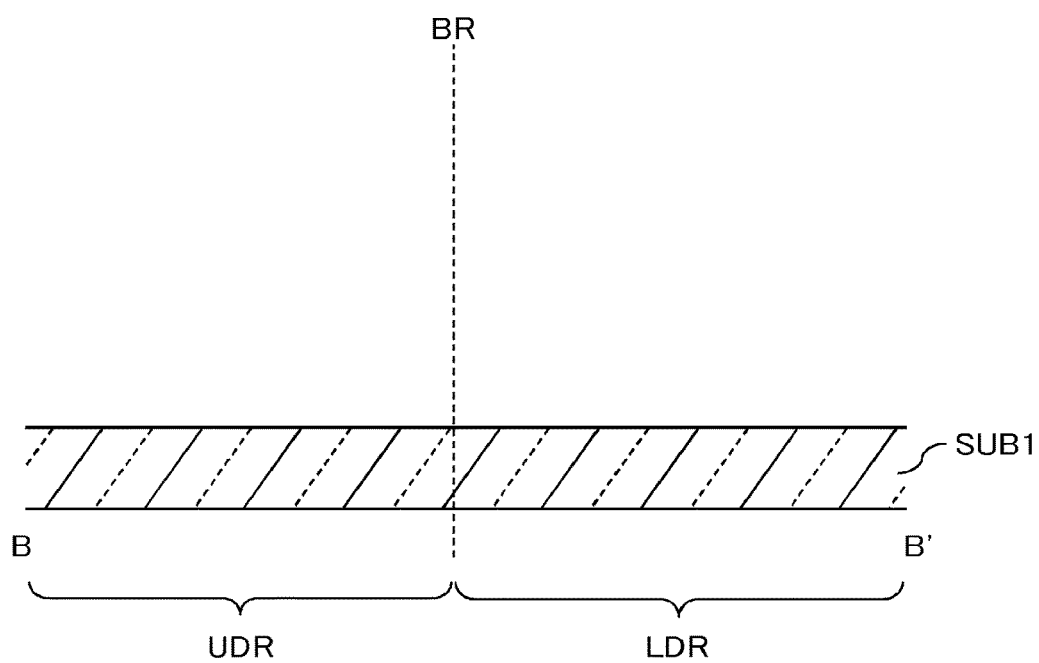

At a step shown in FIGS. 4A and 4B, the gate electrode GAL is formed. Initially, a metal film made of metal such as Cu, Al, and the like, is formed on the transparent substrate SUB1 by, for example, a sputtering method. Then, a photoresist pattern is formed on the metal film, and the metal film is selectively etched by using the photoresist pattern. Thereafter, the photoresist pattern is removed. With the above, the gate electrode GAL is formed on the transparent substrate SUB1 in the pixel area as shown in FIG. 4A. On the other hand, as shown in FIG. 4B, the gate electrode GAL is not formed in the border region BR.

Figure 5A:
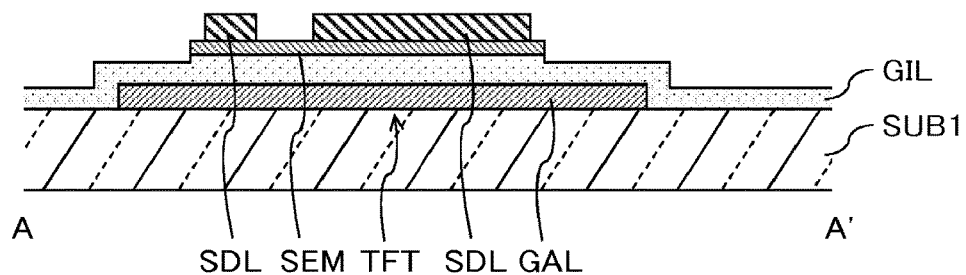
Figure 5B:
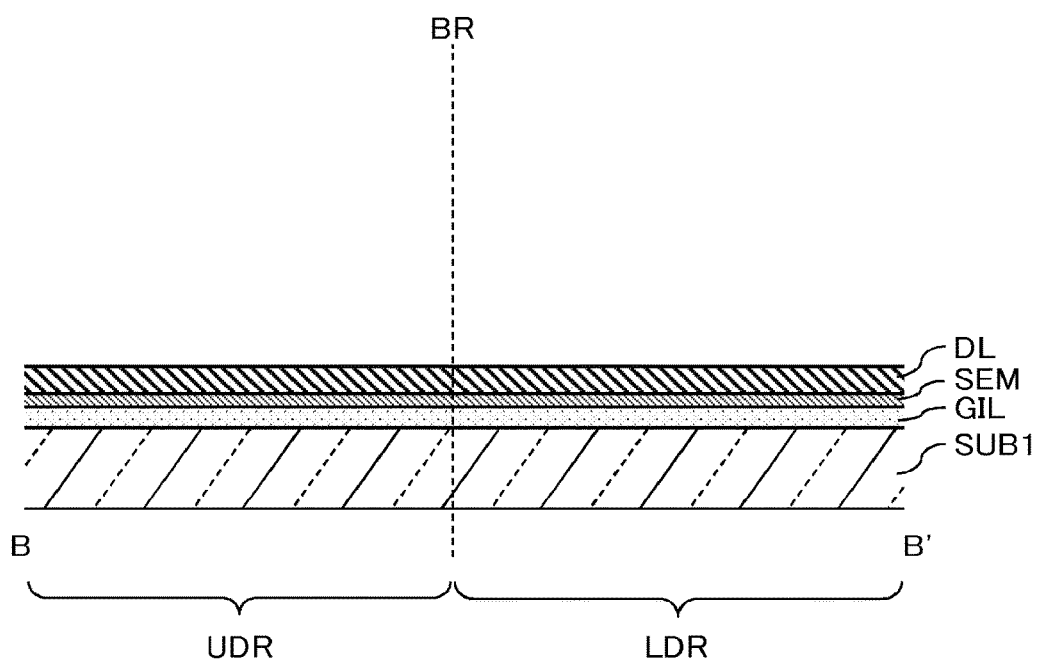

At a step shown in FIGS. 5A and 5B, the gate insulating layer GIL, the semiconductor layer SEM, the source and drain electrodes SDL are formed. The gate insulating layer GIL made of, for example, silicon nitride (SiNx) is formed over the gate electrode GAL. The SiNx layer is formed by a CVD method using ammonia gas, silane gas, and nitrogen gas as source gases. Then, the semiconductor layer SEM, for example, amorphous silicon, is formed over the SiNx layer by a CVD method using silane gas and hydrogen gas. A metal film made of metal such as Cu, Al, and the like is thereafter formed over the amorphous silicon layer by a sputtering method.

Thereafter, a photoresist pattern using a halftone mask is formed on the metal film. By using a halftone mask, a relatively thick photoresist pattern is formed in a region where the source and drain electrodes SDL in FIG. 5A and data lines DL in FIG. 5B are to be formed, and a relatively thin photoresist pattern is formed in a region between the source and drain electrode SDL. No photoresist pattern is formed in a region where both the metal film and the semiconductor layer are etched. Then, the metal film and the semiconductor layer are selectively etched. Then, the thin photoresist pattern is removed by half ashing to expose the metal film, and the metal film in the thereby exposed region is etched. Thereafter, the photoresist pattern is removed. With the above, the gate insulating layer GIL, the semiconductor layer SEM, the source and drain electrodes SDL and data lines DL are formed, whereby the TFT is completed.

In this first embodiment, the source and drain electrodes SDL and the semiconductor layer SEM are formed with the halftone mask in one photolithography step. In some embodiments, the step of forming the source and drain electrodes SDL and the step of forming the semiconductor layer SEM may be conducted in separate photolithography steps. In this case, the semiconductor layer SEM is not formed under the data lines DL and the data lines DL are formed directly on the gate insulating layer GIL.

In a conventional manufacturing method of a liquid crystal display device, upper data lines UDL for an upper display region UDR and lower data lines LDL for a lower display region LDR are formed as separate lines. In other words, an upper data line UDL for the upper display region UDR and a lower data line LDL for the lower display region LDR in the same column are formed as separate lines, and a gap exists in the border region BR from the beginning of the manufacturing process. In contrast, according to this embodiment of the present disclosure, at this step, data lines DL are formed to be extended from a top to a bottom of the liquid crystal panel LCP, as one line, to be overlapped with the border region BR as shown in FIG. 5B.

Figure 6A:
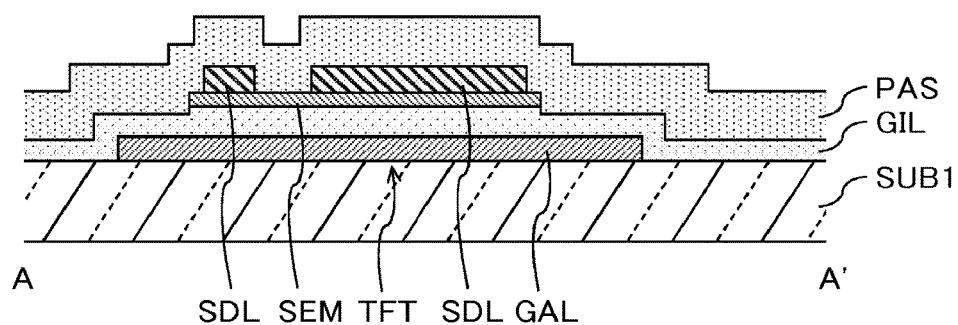
Figure 6B:
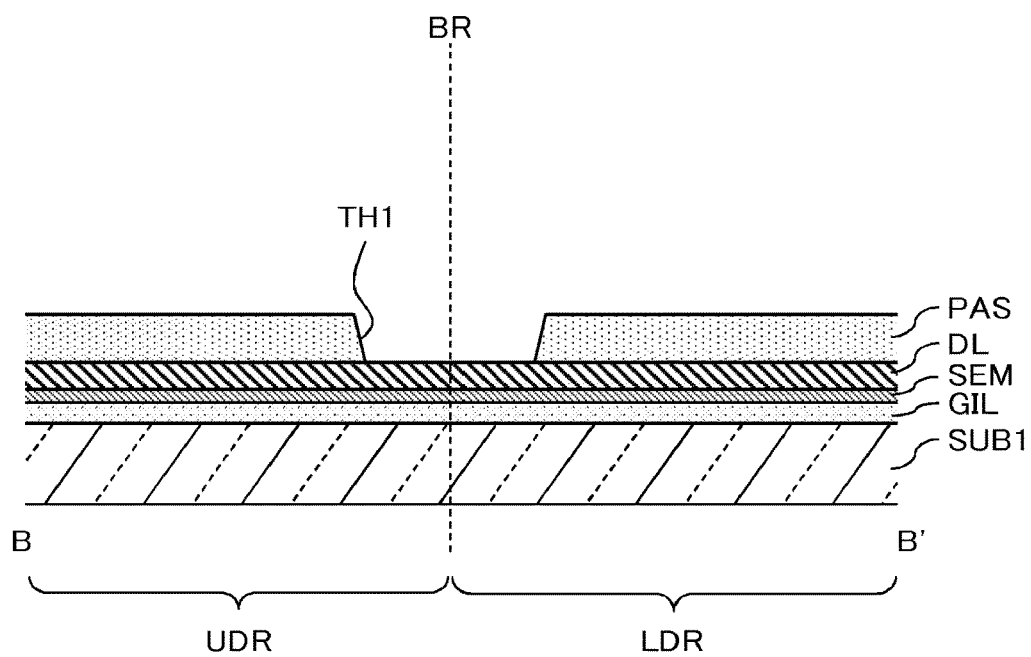

At a step shown in FIGS. 6A and 6B, the passivation layer PAS is formed over the TFT and the gate insulating layer. The passivation layer PAS includes, for example, silicon nitride (SiNx). A SiNx layer is formed by a CVD method by using, for example, ammonia gas, silane gas, and nitrogen gas as source gases. Then, a photoresist pattern is formed on the SiNx layer and the SiNx layer is selectively etched. In the border region BR, a first though hole TH1 is formed in the passivation layer PAS such that the data line DL in the border region BR is exposed at the bottom thereof as shown in FIG. 6B. Thereafter, the photoresist pattern is removed. No hole is formed in a pixel area as shown in FIG. 6A.

Figure 7A:
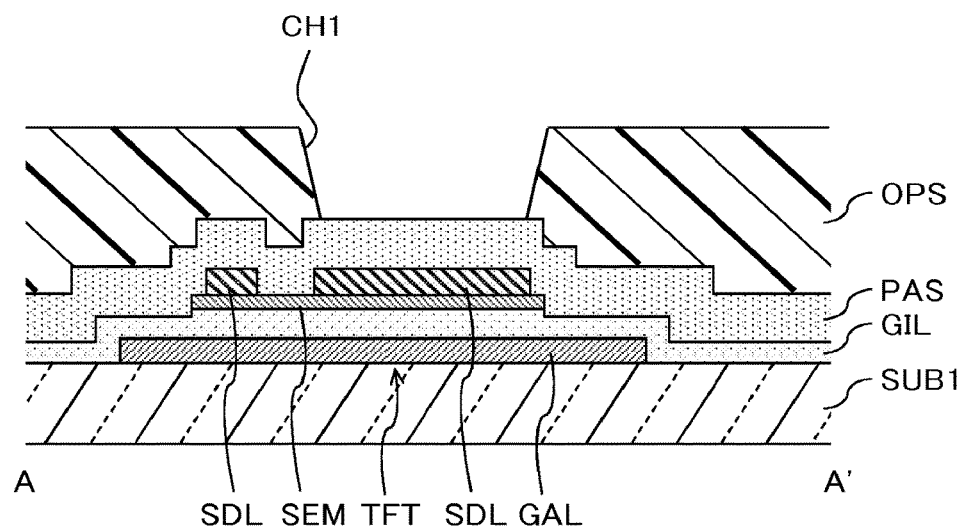
Figure 7B:
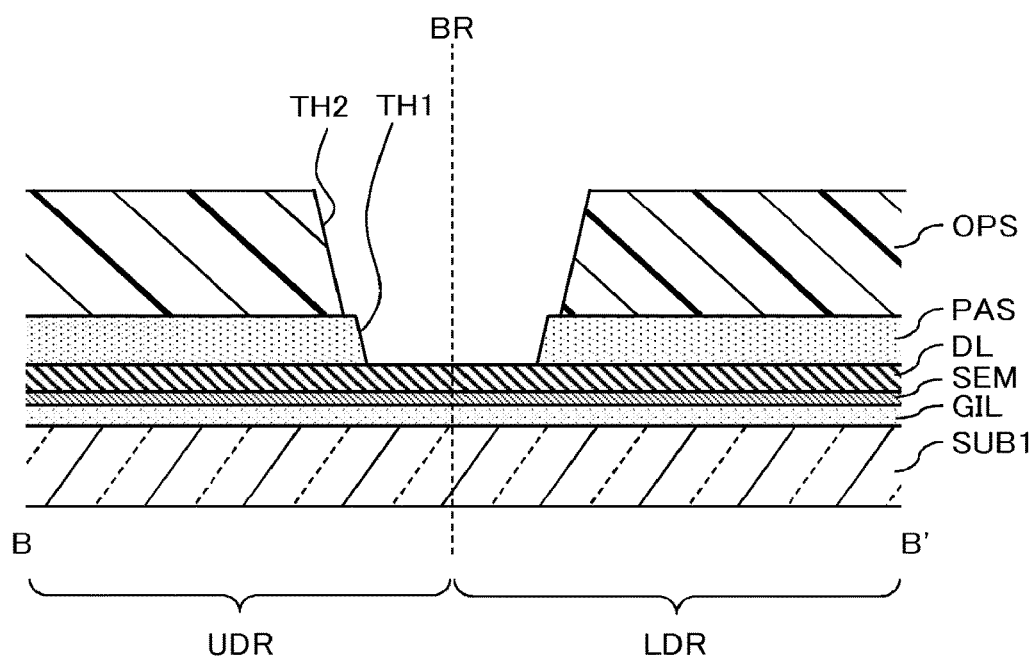

At a step shown in FIGS. 7A and 7B, the organic insulating layer OPS is formed. The organic insulating layer OPS is formed by, for example, coating a liquid organic material over the passivation layer PAS and curing the coated organic material. Acrylic resin, for example, may be utilized as the organic material for forming the organic insulating layer OPS, though this is not limiting, and silicone resin, epoxy resin, polyimide resin, and the like, are also usable. By using a liquid organic material with relatively larger thickness, the organic insulating layer OPS can planarize the underlying structure, and its top surface is substantially flat. The minimum thickness of the organic insulating layer OPS is larger than the thickness of the passivation layer PAS and the thickness of the upper insulating layer UPS.

Thereafter, a photoresist pattern is formed on the organic insulating layer OPS. The organic insulating layer OPS is selectively etched. In the pixel area, as shown in FIG. 7A, a first contact hole CH1 is formed in a part of the organic insulating layer OPS above the drain electrode SDL such that the passivation layer PAS is exposed at the bottom thereof. At the same time, in the border region BR shown in FIG. 7B, a second through hole TH2 is formed in a part of the organic insulating layer OPS above the data line DL in the border region BR such that data line DL and the passivation layer PAS are exposed at the bottom thereof. Thereafter, the photoresist pattern is removed. With the above, the organic insulating layer OPS is formed in the passivation layer PAS, and the first contact hole CH1 and the second through hole TH2 are formed in the organic insulating layer OPS as shown in FIGS. 7A and 7B.

Figure 8A:
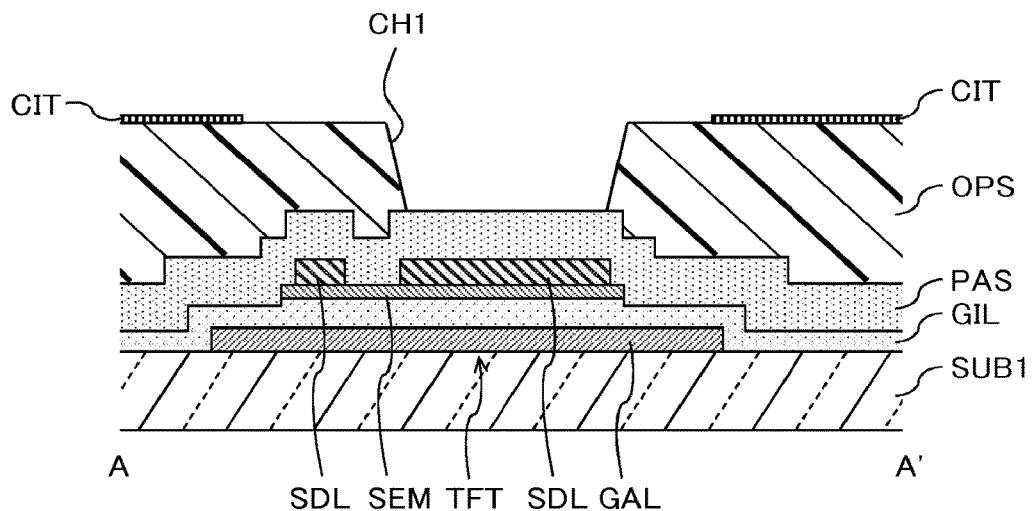
Figure 8B:
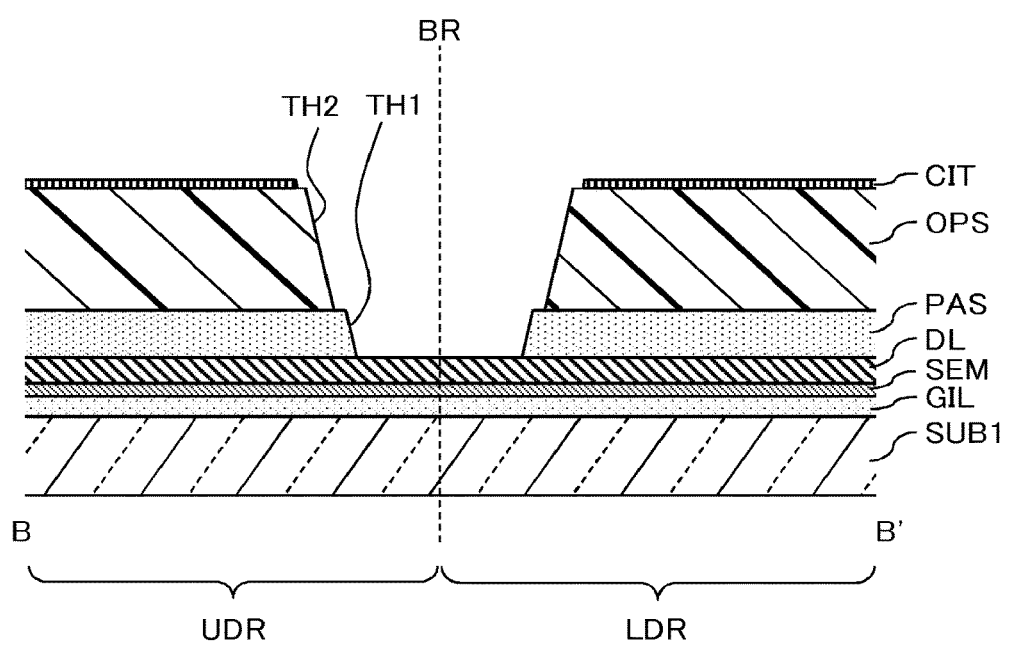

At a step shown in FIGS. 8A and 8B, the common electrode CIT is formed. A transparent conductive film made of oxide, such as ITO, or the like, is formed on the organic insulating layer OPS by sputtering. Then, the transparent conductive film is etched to be removed in a vicinity of the first contact hole CH1 and the second through hole TH2. Thereafter, the photoresist pattern is removed. With the above, the common electrode CIT is formed.

Figure 9A:
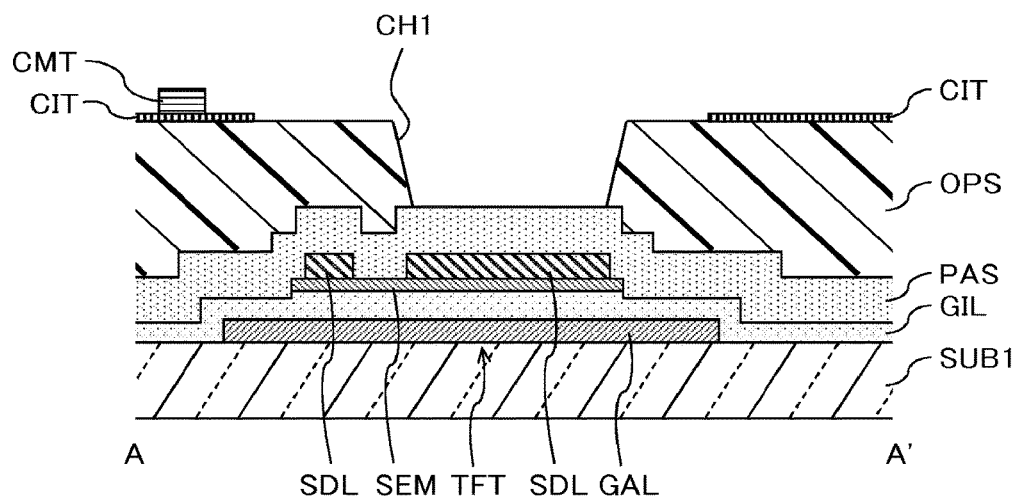
Figure 9B:
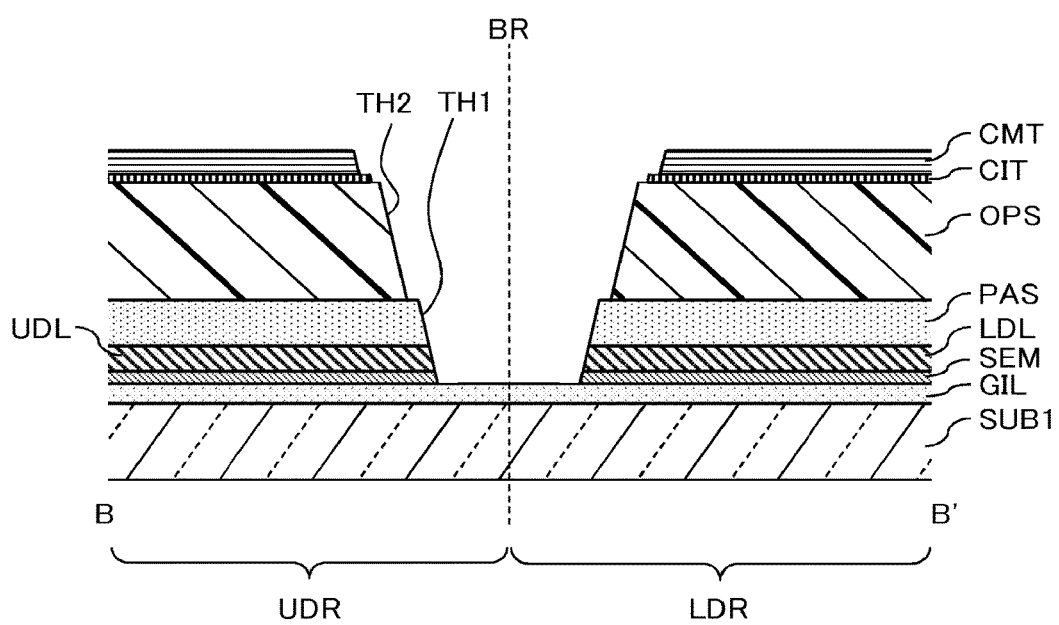

At a step shown in FIGS. 9A and 9B, the common metal lines CMT are formed on the common electrode CIT. A metal film made of metal, such as Cu, Al, or the like is further formed by sputtering. In this embodiment, the metal film is made of the same metal as the data lines. The metal film as deposited covers the first and second through holes TH1 and TH2. Then, as shown in FIG. 9A, the metal film is etched to be shaped into common metal lines CMT. In this embodiment, the common metal line CMT is formed to extend in the same direction as the data lines DL and is overlapped with the data lines DL. In other embodiments, the common metal line CMT may be formed to be overlapped with the gate line GL as well. As shown in FIG. 9B in the vicinity of the border region BR, the metal film and the data line DL are etched at the same time. At this step, the data line DL in the border region is separated into an upper data line UDL in the upper display region UDR and a lower data line LDL in the lower display region LDR as shown in FIG. 9B. At this step, the upper data line UDL and the lower data line LDL are separated with each other for the first time. Thereafter, the photoresist pattern is removed. With the above, common metal line CMT is formed. In this first embodiment, after the step of etching the data line DL for separating the data line DL into the upper data line UDL and the lower data line LDR, the semiconductor layer SEM which had been present under the etched data line DL is also etched as shown in FIG. 9B. In some embodiments, the semiconductor layer SEM may not be etched and may be left in a space between the upper and lower data line UDL, LDR. Because the semiconductor layer SEM has high resistance, the upper data line UDL and the lower data line LDR are electrically isolated from each other.

Until this step, since each data line UDL, LDL in both regions UDR and LDR is connected to each other (i.e., not separated from each other), which makes the surrounding structure the same, a TFT located in a vicinity of the border region BR has similar characteristics to a TFT located in a middle of the upper display region UDR or the lower display region LDR, which is far from the vicinity of the border region BR. By later-separating the data lines, a quality of image displayed on the liquid crystal display device LCDD can be increased. Further, because a step of separation of each data line is conducted at the same step of forming the common metal line CMT, it can simplify the manufacturing process of a liquid crystal display device LCDD. In this step, the semiconductor layers which has been formed below data lines DL in the border line are also etched and removed, as shown in FIG. 9B. It is a matter of course that the step of the forming the common metal lines CMT and the step of separation of data lines can be conducted at different steps. In this case, however, one more photolithography step is added. Therefore, it is advantageous of reducing the number of photolithography steps according to this embodiment.

Figure 10A:
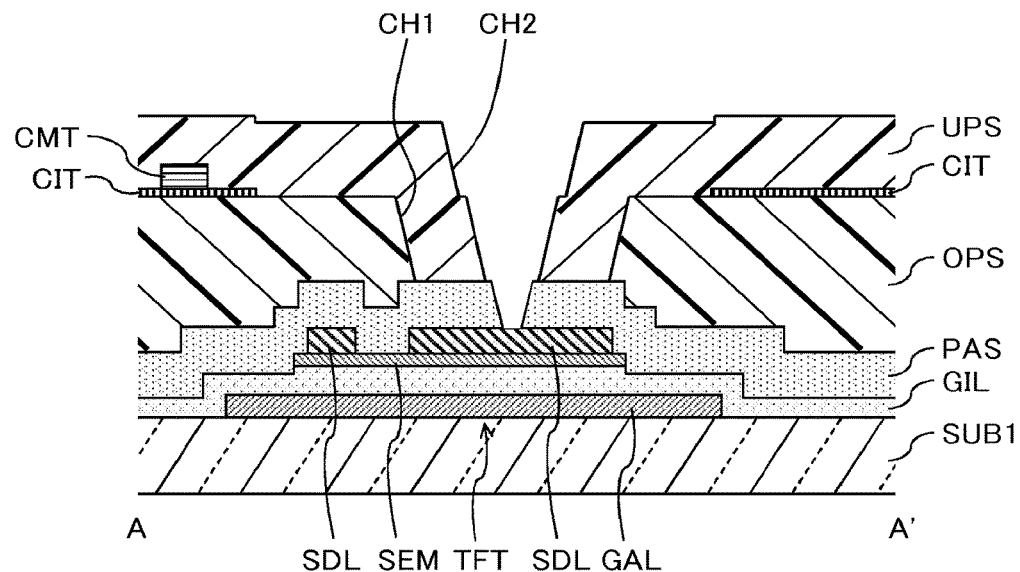
Figure 10B:
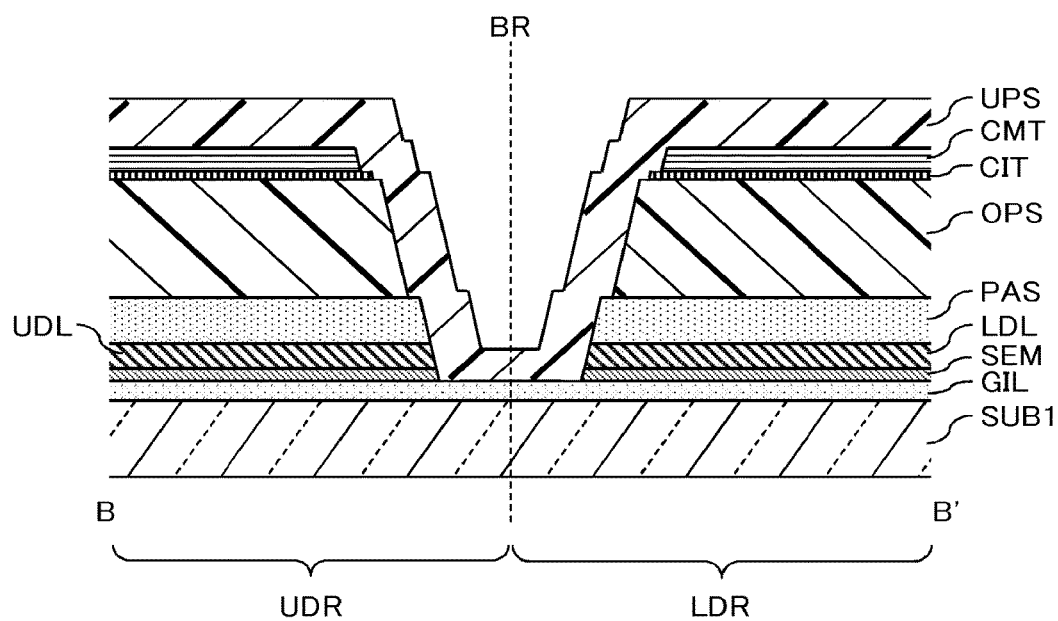

At a step shown in FIGS. 10A and 10B, an upper insulating layer UPS is formed over the organic insulating layer OPS. The upper insulating layer UPS is made of, for example, SiNx formed by CVD using ammonia gas, silane gas, and nitrogen gas. In the pixel area, the upper insulating layer UPS fills the first contact hole CH1 formed in the organic insulating layer OPS and contacts the passivation layer PAS exposed at the bottom of the first contact hole CH1 as shown in FIG. 10B. Similarly, in the border region, the upper insulating layer UPS fills the first and second through holes TH1, TH2 as shown in FIG. 10B. Then, a photoresist pattern is formed on the upper insulating layer UPS, and the upper insulating layer UPS is selectively etched. In the pixel area, a second contact hole CH2 is formed in the passivation layer PAS and the upper insulating layer UPS through inside the first contact hole CH1 of the organic insulating layer OPS, such that the drain electrode is exposed at the bottom thereof in FIG. 10A. No contact hole is formed in the border region in FIG. 10B. Thereafter, the photoresist pattern is removed.

Figure 11A:
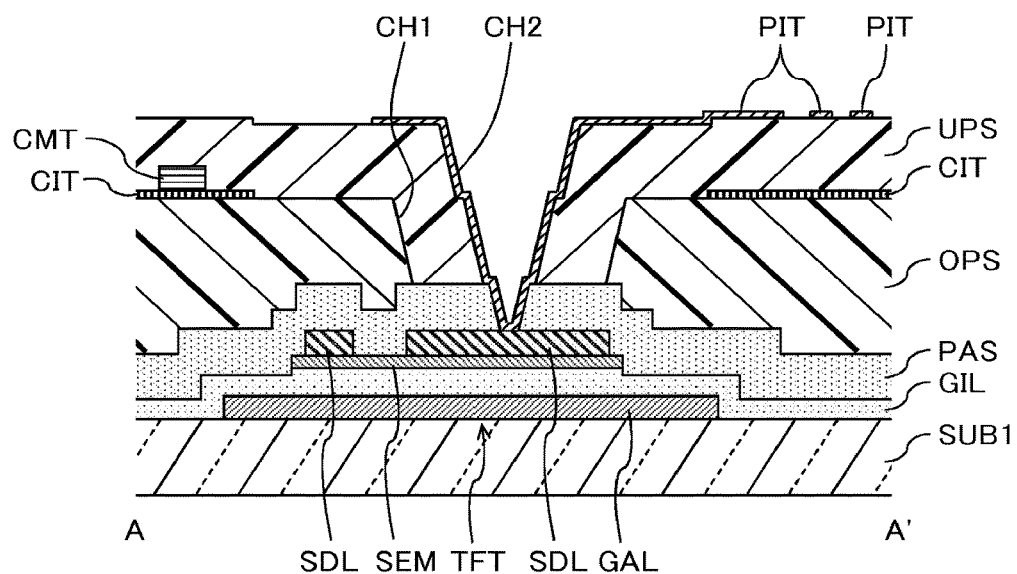
Figure 11B:
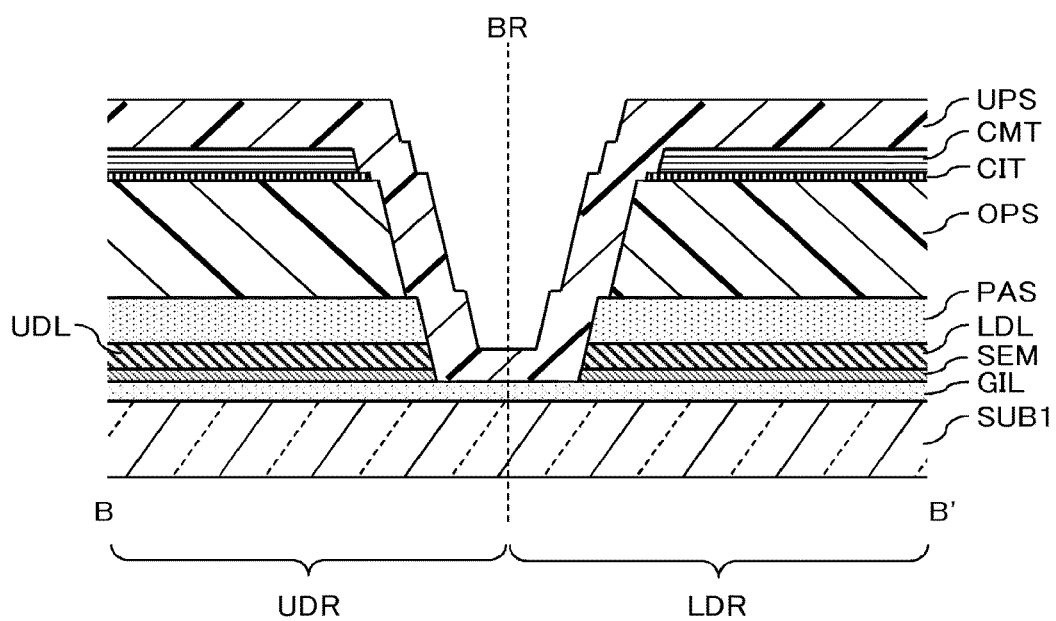

At a step shown in FIGS. 11A and 11B, the pixel electrodes PIT are formed. A transparent conductive film made of oxide, such as ITO or the like, is formed on the upper insulating layer UPS by sputtering. Thereafter, a photoresist pattern is formed on the transparent conductive film, and the transparent conductive film is selectively etched. Thereafter, the photoresist pattern is removed. In the pixel area, the pixel electrodes PIT are formed on the upper insulating layer UPS and in the second contact hole CH2 to be connected to the drain electrode SDL exposed at the bottom thereof in FIG. 11A.

Thereafter, an alignment film (not shown) is formed above the upper insulating layer UPS and the pixel electrodes PIT, and a polarizer plate (not shown) is formed below the transparent substrate SUB1, whereby the TFT substrate is completed. A liquid crystal layer (not shown) is held between the TFT substrate and a color filter substrate (not shown), whereby a liquid crystal panel LCP is completed. When a driving circuit is mounted in such a crystal panel, the liquid crystal display device LCDD is completed.

Second Embodiment

A second embodiment in this present disclosure is described with FIGS. 12A to 12I. An element identical or similar to the element described in the first embodiment is given an identical reference numeral in the respective diagrams, and the detailed explanation thereof may be omitted.

FIGS. 12A to 12I are cross sectional views in a vicinity of the border region BR corresponding to a cross sectional line taken along B-B' of FIG. 2 for illustrating a method of manufacturing a liquid crystal display device LCDD according to this embodiment. FIGS. 12A, 12B, 12D, 12E, 12F, 12G, 12H and 12I correspond to FIGS. 4B, 5B, 6B, 7B, 8B, 9B, 10B and 11B, respectively. Different characters between the first embodiment and the present embodiment will be mainly described in the following descriptions.

Figure 12A:
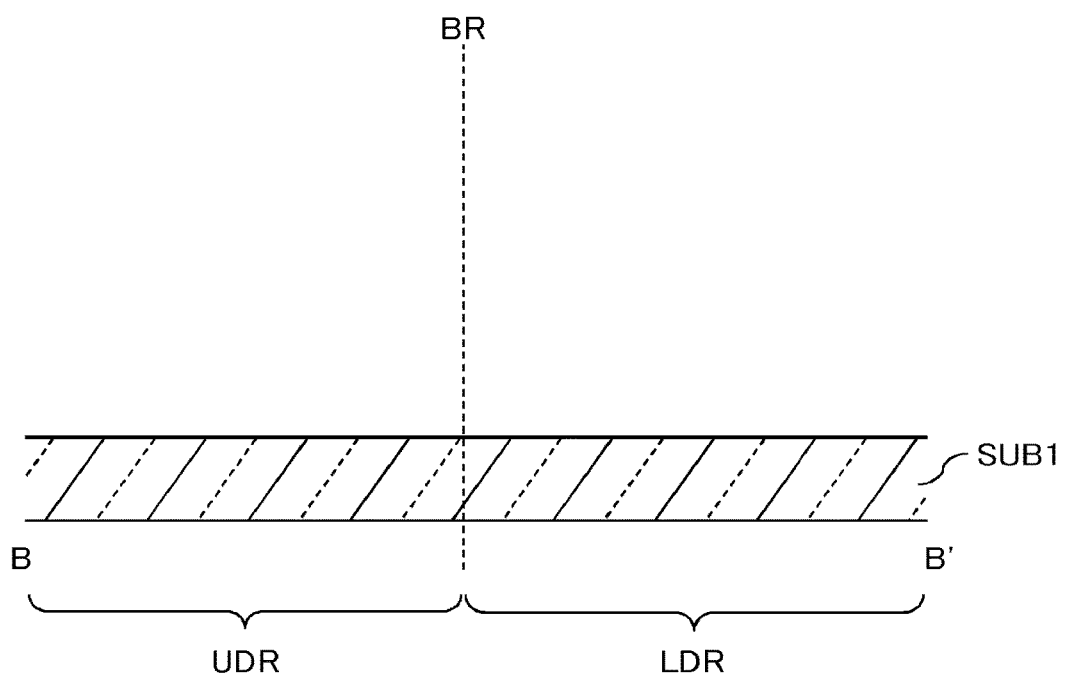
FIGS. 12A to 12I are cross sectional views corresponding to a cross line taken along B-B' of FIG. 2 for illustrating a method of manufacturing a liquid crystal display device according to a second embodiment of the present disclosure.

At a step shown in FIG. 12A, a gate electrode GAL is formed in a manner similar to FIG. 4B. In a vicinity of a border region BR, no gate electrode is formed as shown in FIG. 12A.

Figure 12B:
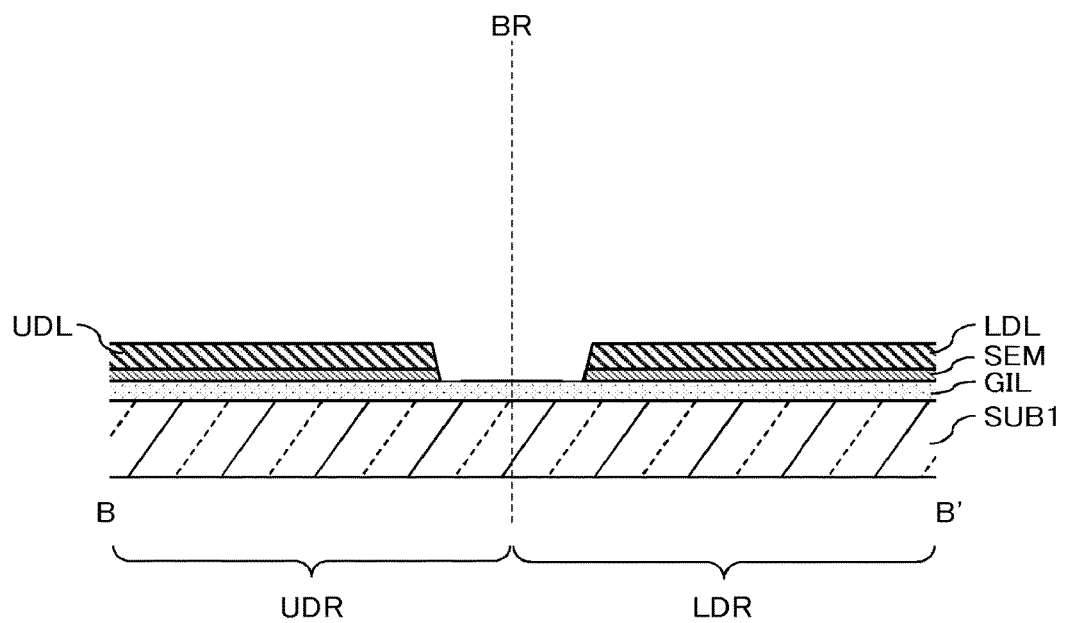

At a step shown in FIG. 12B, a gate insulating layer GIL, a semiconductor layer SEM and, source and drain electrodes SDL are formed. In the first embodiment, the data line is formed to be extended from a top to a bottom of the liquid crystal panel LCP to be overlapped with the border region BR as described with FIG. 5B. In this embodiment, however, a data line is separately formed as shown in FIG. 12B. For example, by forming photoresist patterns corresponding to an upper data line UDL and a lower data line LDL, separate data lines UDL, LDL can be formed by subsequent etching operations. In other embodiments, after long data lines are formed, the long data lines are etched to be separated into a upper data line UDL in the upper display region UDR and a lower data line LDL in the lower display region LDR.

Figure 12C:
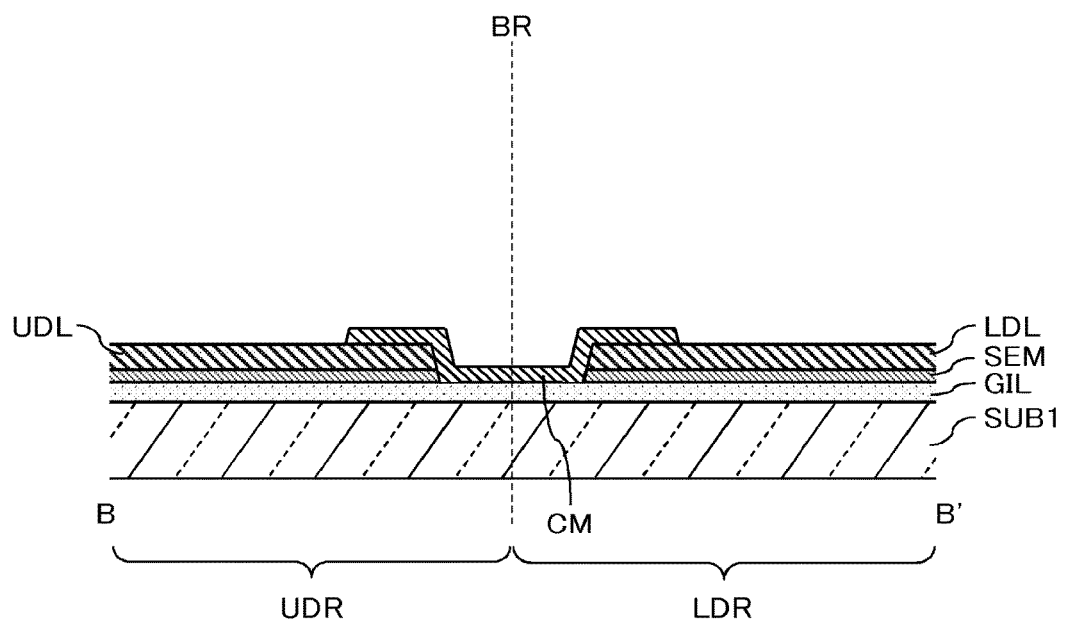

As shown in FIG. 12C, a connecting member CM is formed so as to connect the upper data line UDL and the lower data line LDL. A transparent conductive film made of oxide, such as ITO, or the like, is used as the connecting member CM, and is formed on the semiconductor layer, the data lines DL and gate insulating layer GIL through sputtering. Then, the transparent conductive film is etched to be removed except a space between the upper data lines UDL and the lower data lines LDL in the border region BR. Thereafter, the photoresist pattern is removed. With the above, the connecting member CM is formed to connect between an upper data line UDL and a corresponding lower data line LDL.

In the first embodiment as set forth above, in the step of forming a data line, the data line is formed to be extended from a top to a bottom of the liquid crystal panel LCP as one line to be overlapped with the border region BR as shown in FIG. 5B. In the second embodiment, after each data line is formed in a part in the upper display region UDR and a part in the lower display region LDR separately, it is connected through a conductive member, for example, the connecting member CM in FIG. 12C. In other words, an electrical one line extending from the top to the bottom of the liquid crystal panel LCP is formed by this step of the second embodiment.

FIGS. 13A to 13C are schematic partial plan views in a vicinity of a divided position of data lines and illustrate exemplary structures of the connection between the data lines UDL, LDL for upper and lower display regions UDR and LDR, and the connecting member CM.

As described in FIG. 13A, an upper data line UDL in the upper display region UDR and a corresponding lower data line LDL in the lower display region LDR are connected by the connecting member CM which is overlapped with ends of these data lines UDL, LDL in a vicinity of the border region BR.

In this embodiment, the connecting member CM is formed after the step of forming these data lines UDL, LDL. In other embodiments, the connecting member CM may be formed before the step of forming the data lines as shown in FIG. 13B. In this case, because the semiconductor layer SEM prevents these data lines UDL, LDL from electrically connecting through the connecting member CM, the source and drain electrodes SDL and the semiconductor layer SEM should be formed in separate photolithography steps at the step shown in FIG. 5A and FIG. 5B.

In some embodiments, the connecting member CM does not necessarily connect tip ends of the upper and lower data lines UDL and LDL. As shown in FIG. 13C, the connecting member CM may connect a part of these data lines other than the tip ends. When the connecting member CM is disconnected in a following step, this structure shown in FIG. 13C may help for easy disconnection, because line width of the connecting member CM in FIG. 13C is narrower than line width of the connecting member CM in FIGS. 13A and 13B.

Figure 12D:
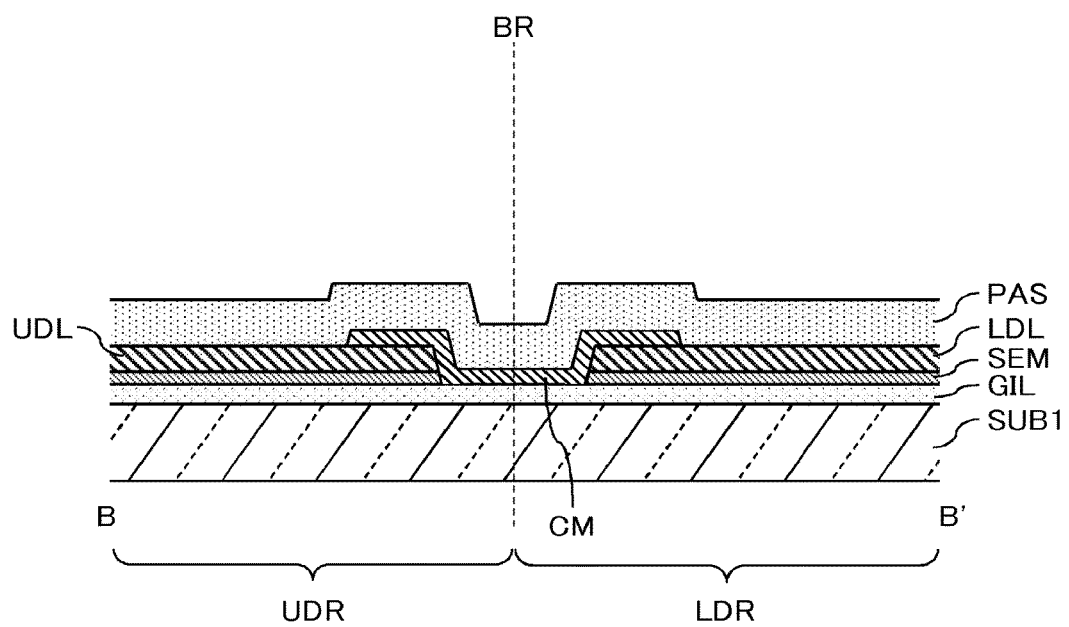

At a step shown in FIG. 12D, a passivation layer PAS is formed over the gate insulating layer GIL, the semiconductor layer SEM, the data lines DL and the connecting member CM. While in the first embodiment, the first though hole TH1 is formed in the passivation layer PAS as described with FIG. 6B, no hole is formed in the passivation layer PAS in a vicinity of the border region BR at this time.

Figure 12E:
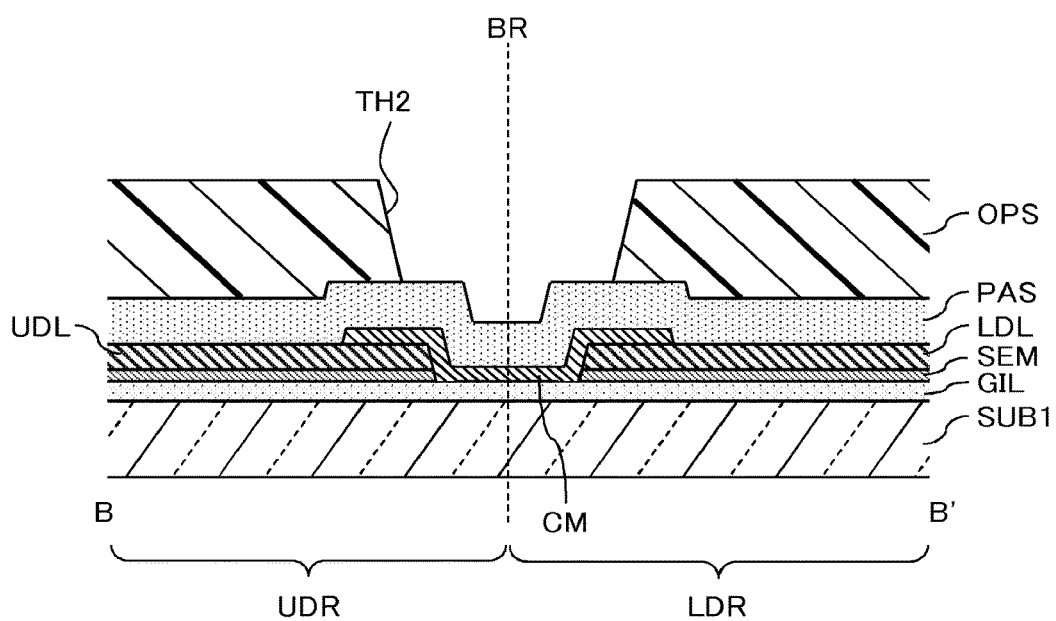
Figure 12F:
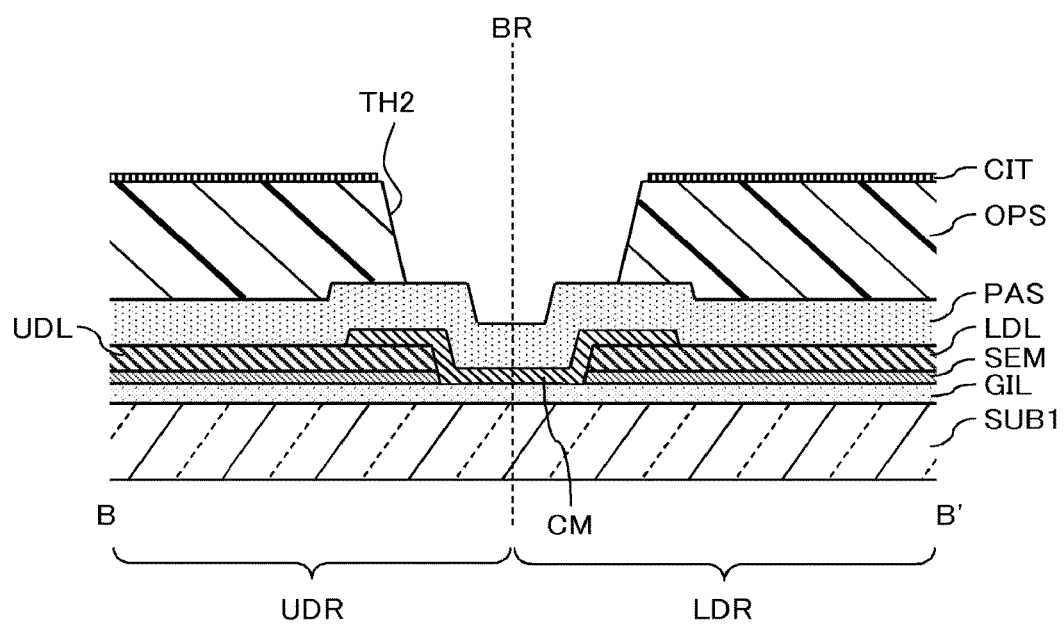
Figure 12G:
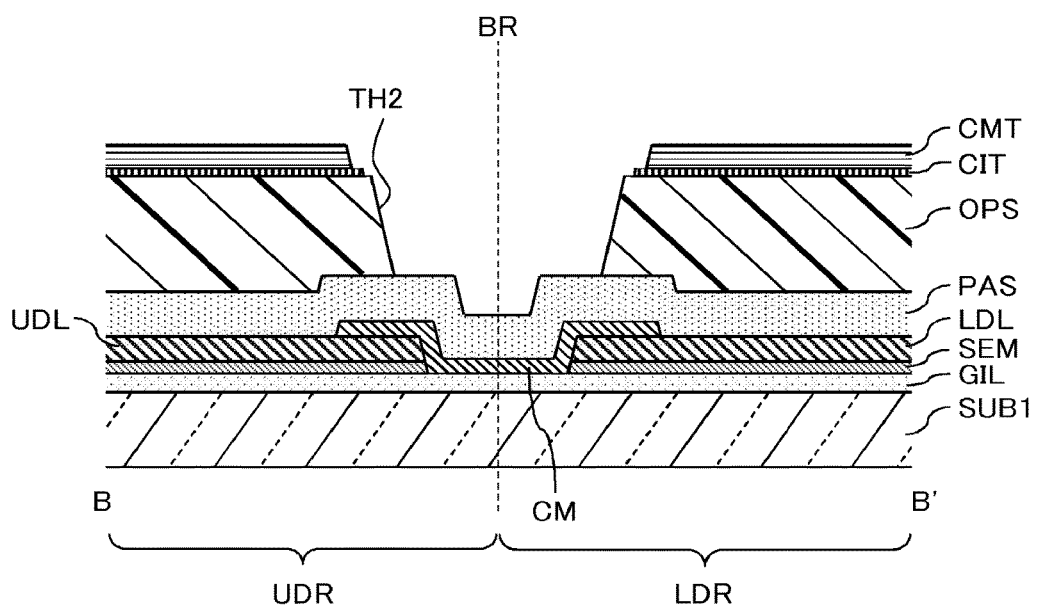

At a step shown in FIG. 12E, an organic insulating layer OPS and a second through hole TH2 therein are formed in a manner similar to FIG. 7B. At the step shown in FIG. 12F, a common electrode CIT is formed in a manner similar to FIG. 8B. At the step shown in FIG. 12G, a common metal line CMT is formed on the common electrode CIT in a manner similar to FIG. 9B.

Figure 12H:
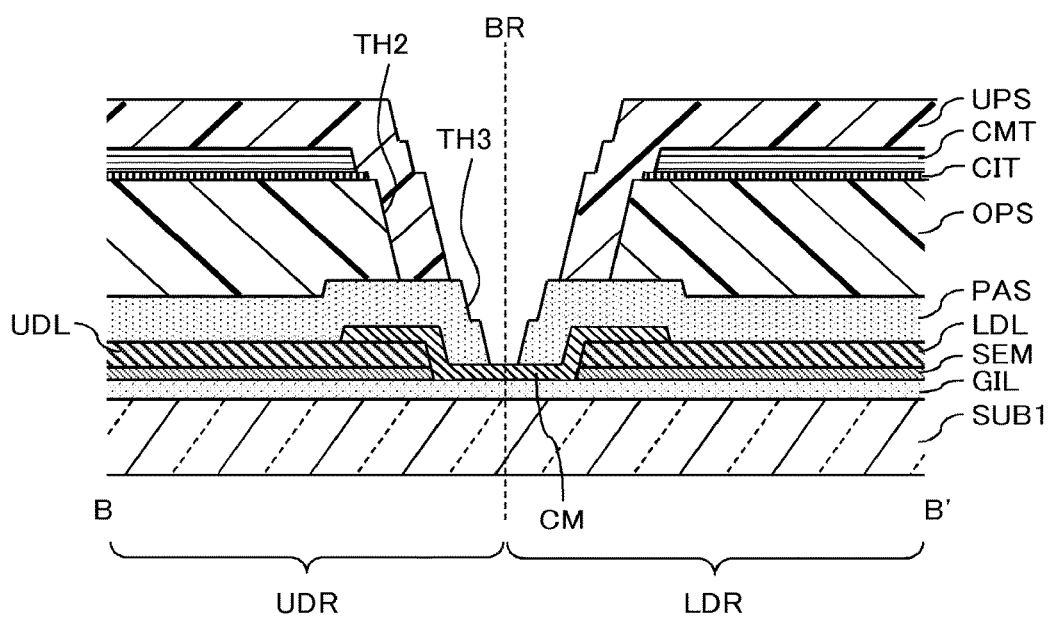

At a step shown in FIG. 12H, an upper insulating layer UPS is formed. While in the first embodiment, no though hole is formed in the upper insulating layer UPS in a vicinity of the border region BR as described with FIG. 10B, in this embodiment, a third through hole TH3 is formed in the upper insulating layer UPS and the passivation layer PAS such that the connecting member CM is exposed at the bottom thereof.

Figure 12I:
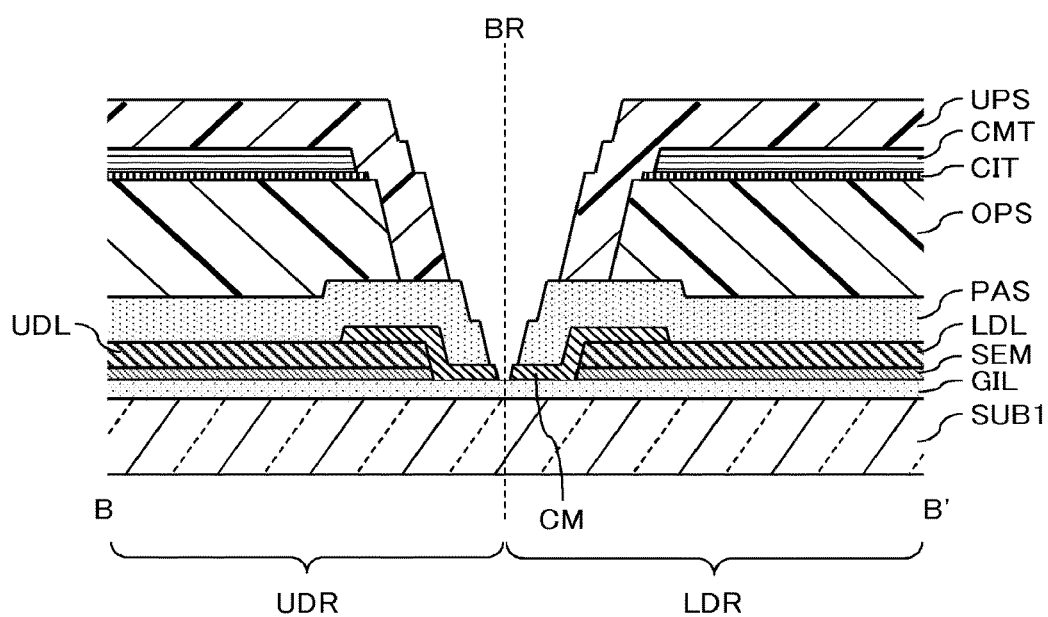

At a step shown in FIG. 12I, a pixel electrode PIT is formed. The connecting member CM made of oxide, such as ITO or the like, is formed on the upper insulating layer UPS by sputtering in a manner similar to FIG. 11B. The connecting member CM is formed in the third through hole TH3 and is exposed from the upper insulating layer UPS and the passivation layer PAS through the third through hole TH3.

When the connecting member CM is selectively etched to form the pixel electrodes PIT in the pixel area, the connecting member CM in the border region is also etched to be separated at the same time. FIGS. 14A to 14C are schematic partial plan views in the vicinity of a divided position of data lines of the liquid crystal display device LCDD after the step shown in FIG. 12I.

FIGS. 14A to 14C correspond to FIGS. 13A to 13C, respectively. To simplify these figures, common metal lines which are overlapped with data lines are omitted. As shown in FIGS. 14A to 14C, the connecting member CM which had connected between the upper data line UDL and the corresponding lower data line LDL is etched and separated. Accordingly, the upper data line UDL and the lower data line LDL are again physically and electrically separated from each other. Since a line width where the connecting member CM is disconnected in FIG. 13C is narrower than that in FIGS. 13A and 13B, it is easier to disconnect the connecting member CM in FIG. 13C than in FIGS. 13A and 13B.

A liquid crystal display device LCDD manufactured by the method according to the second embodiment includes a step of forming the upper data line UDL and the lower data lines LDL which are electrically isolated from each other, and then a step of connecting these data lines with the connecting member CM. The connecting member CM may be formed having a width which is wider than a width of upper and lower data lines UDL, LDL as shown in FIGS. 13A and 13B, because the connection of these data lines is surly conducted. Thus, the connecting member CM may include a part which covers the data line UDL, LDL and the other part which does not cover with the data line UDL, LDL.

According to the second embodiment, during process from the step shown in FIG. 12C to the step in FIG. 12H, the upper data line UDL and the corresponding lower data line LDL are connected through the connecting member CM in a vicinity of the border region BR. By later-separating the data lines, a quality of image displayed on the liquid crystal display device LCDD can be increased. Further, as a step of separation of the data line is conducted at the same step of forming the pixel electrode PIT, it can simplify the manufacturing process of liquid crystal display device LCDD. It is, however, noted that these two steps of separation of the data line and forming the pixel electrode PIT may be conducted at different steps, although one more photolithography step is added.

Third Embodiment

A third embodiment in this present disclosure is described with FIGS. 15A to 15H. An element identical or similar to the element described in the first embodiment is given an identical reference numeral in the respective diagrams, and the detailed explanation thereof may be omitted.

FIGS. 15A to 15H are cross sectional views in a vicinity of the border region BR corresponding to a cross sectional line taken along B-B' of FIG. 2 for illustrating a method of manufacturing a liquid crystal display device LCDD according to this embodiment. FIGS. 15A, 15B, 15C, 15D, 15E, 15F, 15G and 15H correspond to FIGS. 4B, 5B, 6B, 7B, 8B, 9B, 10B and 11B, respectively. Different characters between the first embodiment and the present embodiment will be mainly described as the followings.

Figure 15A:
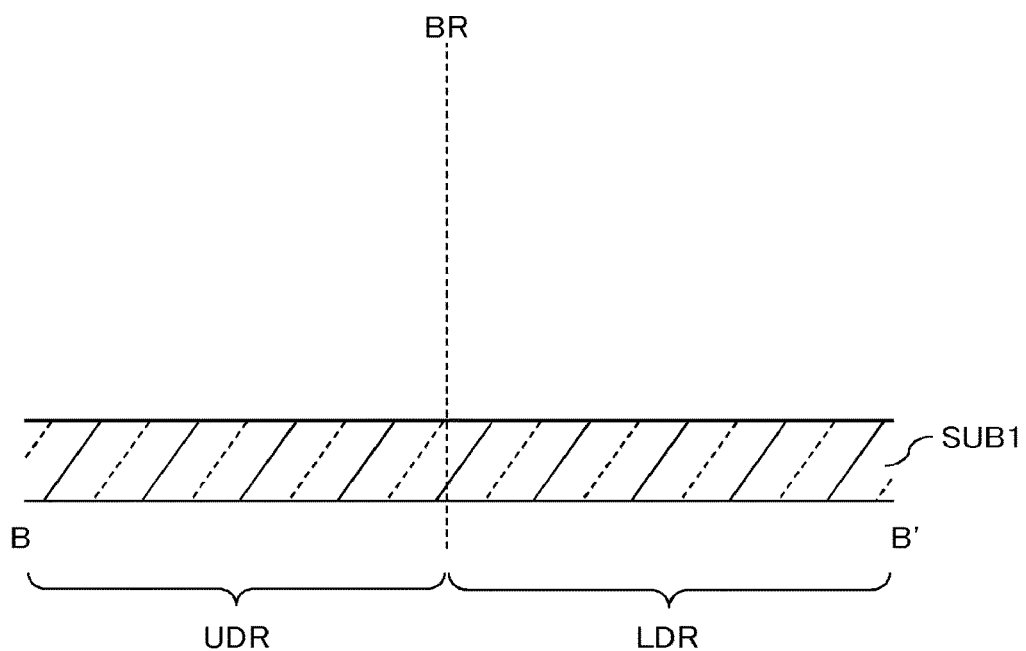
FIGS. 15A to 15H are cross sectional views corresponding to B-B' of FIG. 2 for illustrating a method of manufacturing a liquid crystal display device according to a third embodiment of the present disclosure.

At a step shown in FIG. 15A, a gate electrode GAL is formed in a manner similar to FIG. 4B. In a vicinity of a border region BR, no gate electrode is formed as shown in FIG. 12A.

Figure 15B:
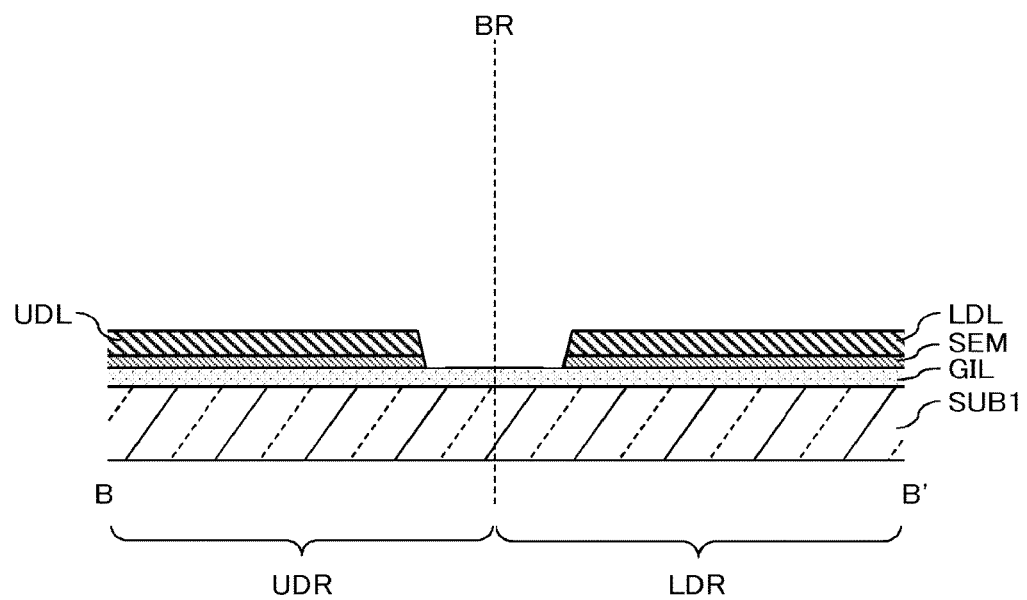

At a step shown in FIG. 15B, a gate insulating layer GIL, a semiconductor layer SEM, source and drain electrodes SDL are formed. In the first embodiment, the data line DL is formed to be extended from a top to a bottom of the liquid crystal panel LCP to be overlapped with the border region BR as described with FIG. 5B. In this embodiment, however, a data line is separately formed as shown in FIG. 15B. For example, by forming photoresist patterns corresponding to an upper data line UDL and a lower data line LDL, separated data lines UDL, LDL can be formed by subsequent etching operations. In other embodiments, after long data lines are formed, the long data lines are etched to be separated into an upper data line UDL in the upper display region UDR and a lower data line LDL in the lower display region LDR.

Figure 15C:
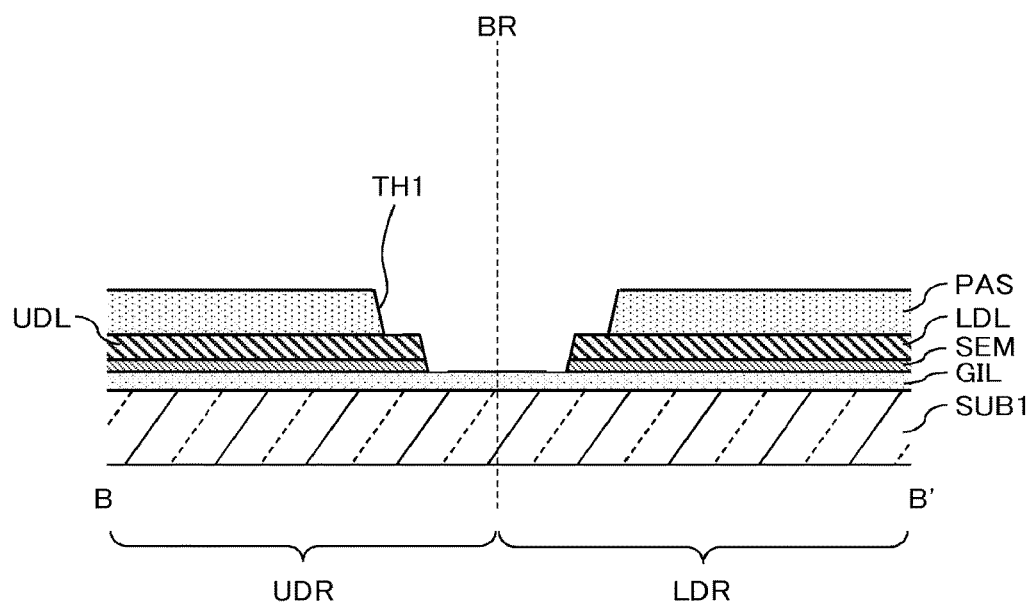
Figure 15D:
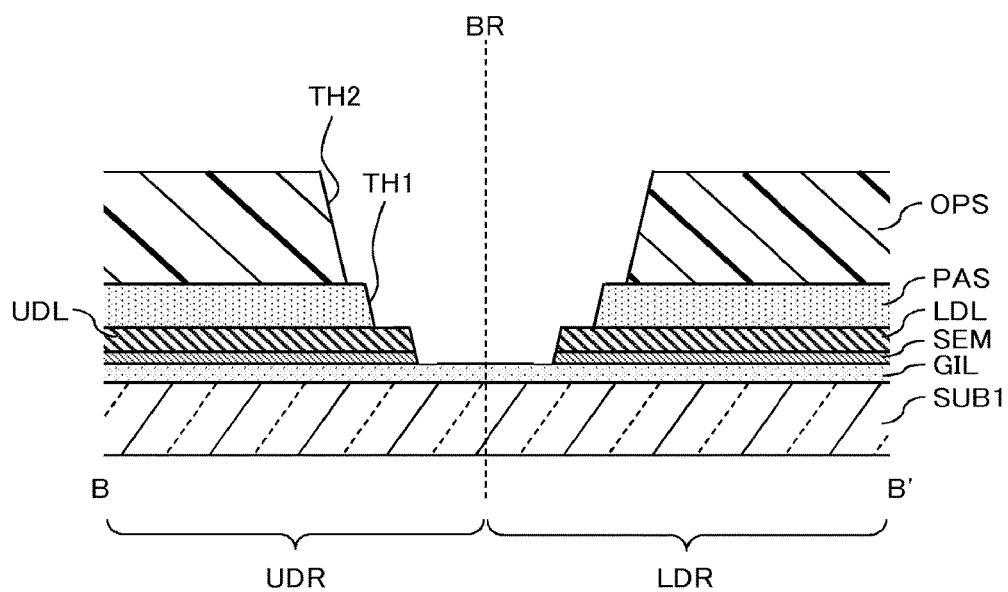

At a step shown in FIG. 15C, a passivation layer PAS and a first though hole TH1 therein are formed in the border region BR in a manner similar to FIG. 6B. At a step shown in FIG. 15D, an organic insulating layer OPS and a second through hole TH2 therein are formed in a manner similar to FIG. 7B.

Figure 15E:
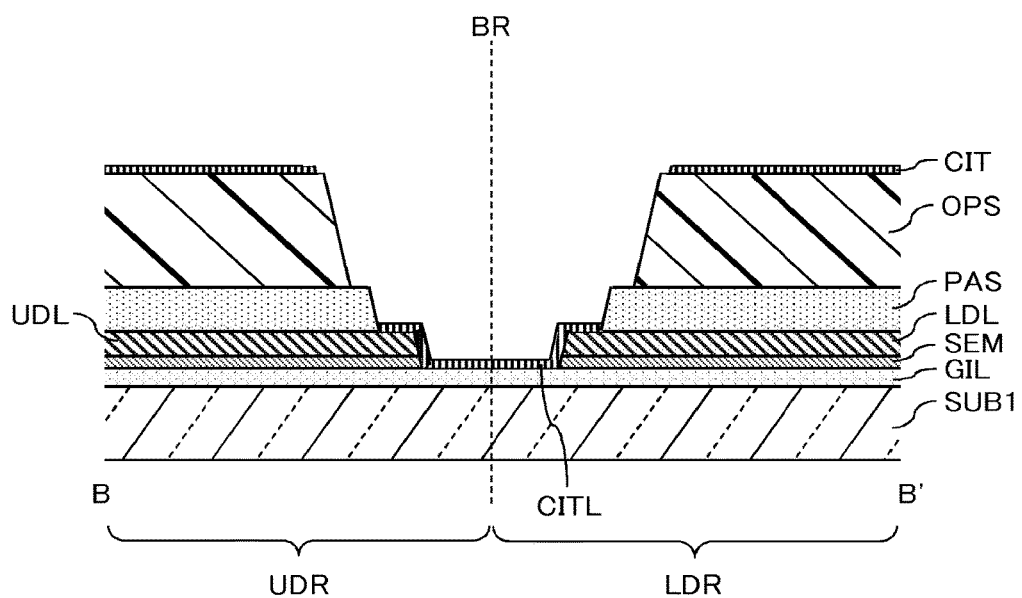

At a step shown in FIG. 15E, a common electrode CIT is formed. A transparent conductive film made of oxide, such as ITO, or the like, is formed on the organic insulating layer OPS by sputtering. The transparent conductive film made of oxide is accumulated in the first through hole TH1 and the second through hole TH2 and contacts ends of two data lines UDL, LDL in a vicinity of the border region BR, which are exposed from the passivation layer PAS and the organic insulating layer OPS. Then, the transparent conductive film is etched to form a common electrode layer CITL in the vicinity of data lines in the border region BR. With the above, the common electrode layer CITL is formed to connect between the upper data lines UDL and the corresponding lower data line LDL. In other words, an electrical one line extending from the top to the bottom of the liquid crystal panel LCP is formed by this step of the third embodiment.

Figure 15F:
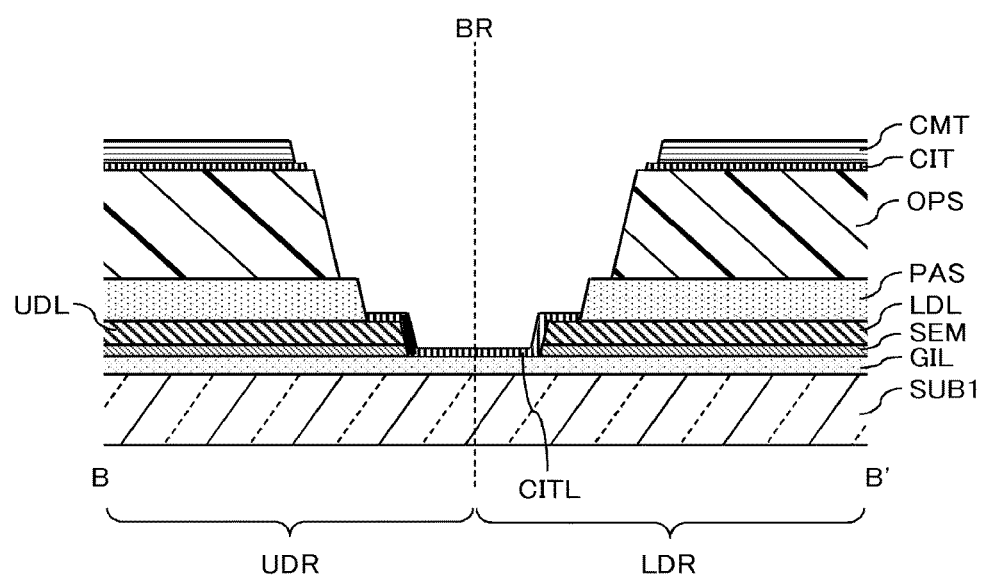

At a step shown in FIG. 15F, the common metal line CMT is formed on the common electrode CIT in a manner similar to FIG. 9B.

Figure 15G:
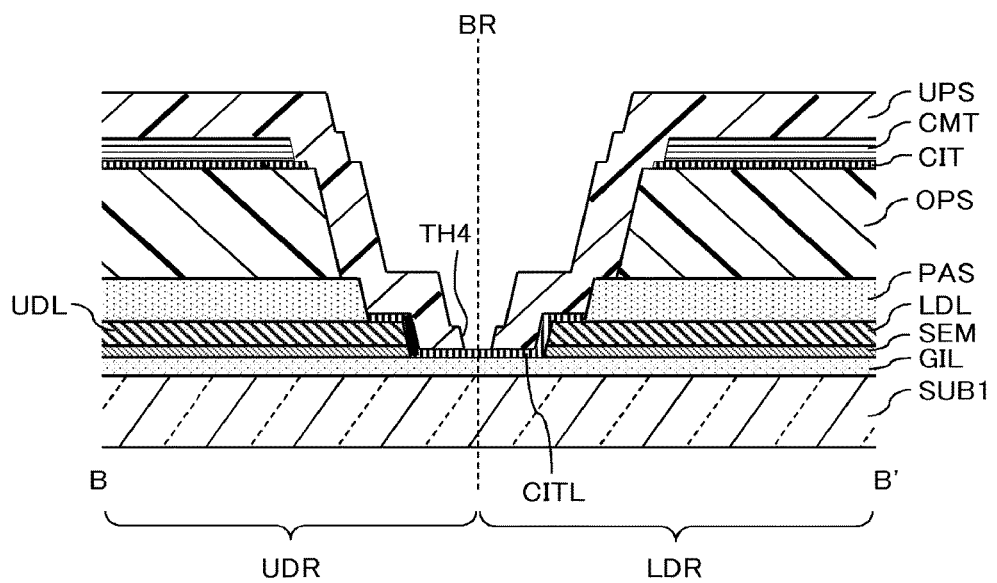

At a step shown in FIG. 15G, an upper insulating layer UPS is formed. While in the first embodiment, no though hole is formed in the upper insulating layer UPS in a vicinity of the border region BR as described with FIG. 10B, in this embodiment, a fourth through hole TH4 is formed in the upper insulating layer UPS such that the common electrode layer CITL is exposed at the bottom thereof.

Figure 15H:
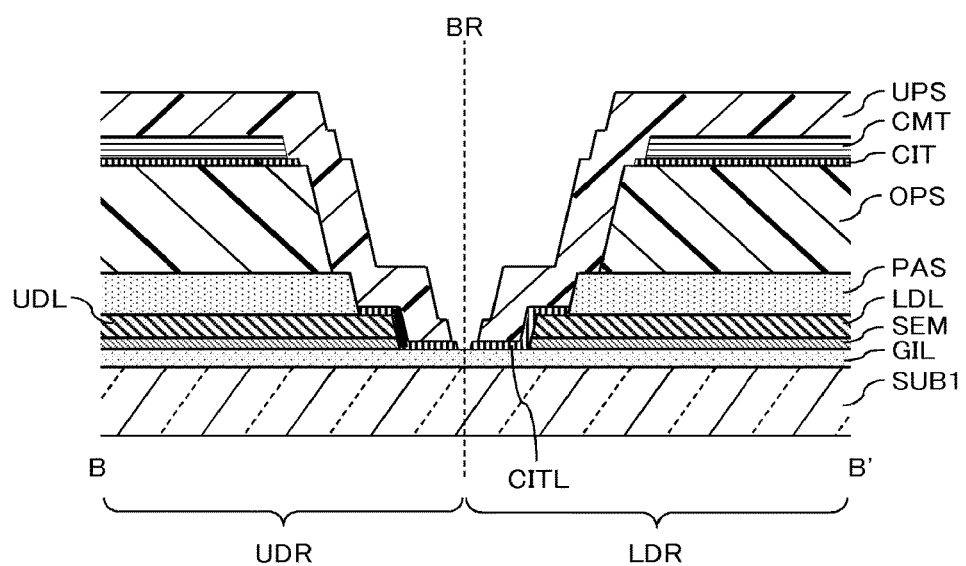

At a step shown in FIG. 15H, a pixel electrode PIT is formed. A transparent conductive film made of oxide, such as ITO or the like, is formed on the upper insulating layer UPS by sputtering in a manner similar to FIG. 11B. The transparent conductive film is formed in the fourth through hole TH4 and is accumulated on the common electrode layer CITL exposed from the upper insulating layer UPS through the fourth through hole TH4. When the transparent conductive film is selectively etched to form the pixel electrode PIT in the pixel area, the common electrode layer CITL in the border region is also etched to separate the data line into two data lines UDL, LDL at the same time. By these operations, the upper data line UDL and the lower data line LDL are again physically and electrically separated from each other.

According to the third embodiment, during process from the step shown in FIG. 15E to the step in FIG. 15G, the upper data line UDL and the corresponding lower data line LDL are connected through the common electrode layer CITL in a vicinity of the border region BR. By later-separating the data lines, a quality of image displayed on the liquid crystal display device LCDD can be increased. Further, as a step of separation of the data line is conducted at the same step of forming the pixel electrode PIT, it can simplify the manufacturing process of liquid crystal display device LCDD. It is, however, noted that these two steps of separation of the data line and forming the pixel electrode may be conducted at different steps, although one more photolithography step is added.

The present disclosure is not limited to the first, second and third embodiments described above, and may be replaced with the substantially same configuration as those described in the first, second and third embodiments, a configuration having the same effect of operation or a configuration that can achieve the same object. For example, in these embodiments, present disclosure has been described with an IPS mode of an LCD device as a preferable example. However, an application of the present subject matter is not restricted to this, but it is applicable to any mode of LCD device such as, a Vertical Alignment (VA) mode or an Optically Compensated Bend (OCB) mode as well as the other display device such as an organic light emitting diode TV.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations for the purpose of streamlining the disclosure. This method of disclosure is not to be interpreted as reflecting an intention that the claimed implementations require more features than are expressly recited in each claim. Rather, as the following claims reflect, inventive subject matter lies in less than all features of a single disclosed implementation. Thus the following claims are hereby incorporated into the Detailed Description, with each claim standing on its own as a separately claimed subject matter.

What is claimed is:

1. A display device comprising:
   a display region for displaying image,
   a plurality of data lines extending in a first direction in the display region, and
   a plurality of gate lines extending in a second direction which is different from the first direction in the display region, and
   a plurality of pixel electrodes, each of a plurality of pixel electrode connecting to one of the plurality of data lines and one of the plurality of gate lines,
   wherein:
      the display region is divided into a first display region and a second display region by a border region extending in the second direction,
      the plurality of data lines include a plurality of first data lines arranged in the first display region, and a plurality of second data lines arranged in the second display region,
      each of the plurality of first data lines is electrically isolated from each of the plurality of second data lines,
      each of the plurality of first data lines and the plurality of second data lines includes a metal layer and a conductive member, the conductive member is made of a same material as the plurality of pixel electrodes, and
      the conductive member is overlapped with at least an end part of the metal layer of each of the plurality of first data lines and the plurality of second data lines in the border region.

2. The display device according to claim 1, wherein:
the conductive member includes a first part and a second part,
the first part of the conductive member is overlapped with the metal layer of each of the plurality of first data lines and the plurality of second data lines in planar view, and
the second part of the conductive member is not overlapped with the metal layer of each of the plurality of first data lines and the plurality of second data lines in planar view.

3. The display device according to claim 1, wherein:
the conductive member is disposed between the plurality of data lines and the plurality of gate lines in a laminated direction.

4. The display device according to claim 1, wherein:
the conductive member is disposed between the plurality of pixel electrodes and the plurality of gate lines in a laminated direction.

5. The display device according to claim 2, wherein:
the conductive member is overlapped with at least an end part of the metal layer except the tip end of each of the plurality of first data lines and the plurality of second data lines in the border region.

* * * * *